United States Patent

Murphy et al.

[19]

[11] Patent Number: 5,855,755
[45] Date of Patent: *Jan. 5, 1999

[54] METHOD OF MANUFACTURING PASSIVE ELEMENTS USING CONDUCTIVE POLYPYRROLE FORMULATIONS

[75] Inventors: Oliver J. Murphy; G. Duncan Hitchens, both of Bryan; Dalibor Hodko, College Station; Eric T. Clarke, Bryan; David L. Miller, Austin; Donald L. Parker, Bryan, all of Tex.

[73] Assignee: Lynntech, Inc., College Station, Tex.

[ * ] Notice: The term of this patent shall not extend beyond the expiration date of Pat. No. 5,545,308.

[21] Appl. No.: 630,063

[22] Filed: Apr. 12, 1996

Related U.S. Application Data

[63] Continuation-in-part of Ser. No. 491,625, Jun. 19, 1995, Pat. No. 5,545,308, and a continuation-in-part of Ser. No. 492,235, Jun. 19, 1995.

[51] Int. Cl.$^6$ .............................. C25D 5/02; C25D 5/54; C08F 2/48; B21F 41/00
[52] U.S. Cl. .......................... 205/122; 205/125; 205/162; 205/163; 205/164; 205/166; 205/183; 205/224; 204/157.15; 427/508; 427/510; 427/512; 427/517; 427/518; 427/520; 29/25.03
[58] Field of Search ...................... 204/157.15; 205/125, 205/163, 164, 183, 162, 224, 122, 166; 427/508, 510, 512, 517, 518, 520; 29/25.03

[56] References Cited

U.S. PATENT DOCUMENTS

| | | | |
|---|---|---|---|
| 4,406,826 | 9/1983 | Morgan et al. | 252/512 |
| 4,526,807 | 7/1985 | Auerbach | 427/53.1 |

(List continued on next page.)

FOREIGN PATENT DOCUMENTS

| | | |
|---|---|---|
| 0 495 549 A2 | 7/1982 | European Pat. Off. . |
| WO 94/02886 | 2/1994 | European Pat. Off. . |
| 3338904 A1 | 9/1985 | Germany . |
| 295 676 A2 | 6/1988 | Germany . |
| 58-193390 | 11/1983 | Japan . |
| 1123228 | 5/1989 | Japan . |
| 04-202707 | 7/1992 | Japan . |
| 5-249605 | 9/1993 | Japan . |

OTHER PUBLICATIONS

Yoneyama et al., "Photocatalytic Deposition of Light–Localized Polypyrrole Film Pattern on n–type Silicon Wafers", Chemistry Letters, pp. 657–660, 1986.

Park, Yamamoto, Takeoka and Tsuchida; "Simultaneous Formation of a Polypyrrole Film and a Tantalum Oxide Layer by Electrochemical Oxidation"; Bull. Chem. Soc. Japan, 1992, vol. 65 No. 7, pp. 1860–1865.

H. Meyer, R.J. Nichols, D. Schroeder and L. Stamp, "The Use of Conducting Polymers and Colloids in the Through Hole Plating of Printed Circuit Boards," vol. 39, pp. 1325–1338 1994, month unavailable.

Michael Carano, "Plated Through–hole Processing: An Integrated Approach," Planting and Surface Finishing, Aug. 1994, pp. 23–28.

(List continued on next page.)

*Primary Examiner*—Kathryn L. Gorgos
*Assistant Examiner*—Edna Wong
*Attorney, Agent, or Firm*—Streets & Associates

[57] ABSTRACT

The present invention provides electronically conducting polymer films formed from photosensitive formulations of pyrrole and an electron acceptor that have been selectively exposed to UV light, laser light, or electron beams. The formulations may include photoinitiators, flexibilizers, solvents and the like. These formulations can be used to manufacture multichip modules on typical multichip module substrates, such as alumina, fiberglass epoxy, silicon and polyimide. The formulations and methods of the invention enable the formation of passive electronic circuit elements such as resistors, capacitors and inductors in multichip modules or printed wiring boards.

61 Claims, 10 Drawing Sheets

U.S. PATENT DOCUMENTS

| | | | |
|---|---|---|---|
| 4,619,741 | 10/1986 | Minten et al. | 204/15 |
| 4,683,036 | 7/1987 | Morrissey et al. | 204/15 |
| 4,747,968 | 5/1988 | Gilleo | 252/514 |
| 4,756,848 | 7/1988 | Tieke et al. | 252/511 |
| 4,810,333 | 3/1989 | Gulla et al. | 204/15 |
| 4,963,291 | 10/1990 | Bercaw | 252/512 |
| 5,028,481 | 7/1991 | Stramel | 428/323 |
| 5,071,517 | 12/1991 | Cabayashi | 204/12 |
| 5,120,472 | 6/1992 | Shikatani et al. | 252/500 |
| 5,160,457 | 11/1992 | Elsenbaumer | 252/500 |
| 5,180,523 | 1/1993 | Durand et al. | 252/512 |
| 5,244,562 | 9/1993 | Russell | 204/418 |
| 5,246,627 | 9/1993 | Heeger et al. | 252/500 |
| 5,282,955 | 2/1994 | Leventis et al. | 205/317 |
| 5,378,404 | 1/1995 | Han et al. | 252/500 |
| 5,462,696 | 10/1995 | McGinniss et al. | 252/500 |
| 5,520,852 | 5/1996 | Ikkala et al. | 252/521 |
| 5,545,308 | 8/1996 | Murphy et al. | 205/125 |

OTHER PUBLICATIONS

W. S. Huang, M. Angelopoulos, J.R. White and J.M. Park, "Metallization of Printed Circuit Boards Using Conducting Polyaniline," Mol. Cryst. Liq. Cryst., 1990, vol. 189, pp. 227–235 month unavailable.

D.M. de Leeuw, P.A. Kraakman, P.F.G. Bongaerts, C.M.J. Mutsaers, D.B.M. Klaassen, "Electroplating of Conducting Polymers for the Metallization of Insulators," Synthetic Metals 66 (1994) pp. 263–273 month unavailable.

Francisco A. Uribe, Judith Valerio, and Shimshon Gottesfeld, "Application of Conducting Polymer Precoats for the Metallization of Insulators," Synthetic Metals, pp. 3760–3765 1993, month unavailable.

W. Metzger, J. Hupe and W. Kronenberg, "New Process For Direct Through–Hole Plating of Printed Circuit Boards," Plating and Surface Finishing, pp. 28–32 date unavailable.

"Conductive polymer inks may spell the future of multilayered boards," Technology News, News Analysis, Electronic Design, Feb. 1985, pp. 53–55.

"A Completely New PCB Manufacturing Process — Too Good To Be True?", From the Editor, Electronic Manufacturing, Sep. 1988, p. 4.

Design News, Technology Focus/Materials, "Conducting Polymer Open New Worlds," Jan. 21, 1991, pp. 60–65.

Circuit Technology, Plating and Surface Finishing, "Direct Metallization," p. 34 date unavailable.

Circuit Technology, Plating and Surface Finishing, "The Need for a More Free–Flowing Process," p. 40 date unavailable.

Circuit Technology, Plating and Surface Finishing, "Solerability Requirements For High–density PWBs," p. 34.

Circuit Technology, Plating and Surface Finishing, "Making Waste Minimization & Manufacturing Efficiency Work Together," p. 34. date unavailable.

Circuit Technology, Plating and Surface Finishing, "Processing PWBs in a Clean Room Environment," p. 50.

Circuit Technology, Plating and Surface Finishing, "PC Fabrication's Restructuring," p. 114 date unavailable.

Circuit Technology, "Impact of Advancing Technology on Printed Circuits," p. 33. date unavailable.

Circuit Technology, "The Global Market," Jan. 1994, p. 43.

New Math On Board, pp. 10–11 date unavailable.

"A New Approach to the Metallization of Plastics," Abstract No. 243, p. 354 date unavailable.

Michael Carano, "Novel Approach to the Metallization of Plated Through Hole Printed Wiring Boards," pp. 179–186 date unavailable.

Marie Angelopoulos, Jane M. Shaw and Kam–Leung Lee, "Polyanilines: In Situ Radiation and Thermal Induced Doping," MRS Proceedings Reprint, vol. 214, 1991, Materials Research Study month unavailable.

M. Angelopoulos, G.E. Asturias, S.P. Ermer, A. Ray, E.M. Scherr and A.J. MacDiarmid, M. Akhtar and Z. Kiss, and A.J. Epstein, "Polyaniline: Solutions, Films and Oxidation State," vol. 160, pp. 151–163 date unavailable.

Marie Angelopoulos, Niranjan Patel, Jane M. Shaw, Nancy C. Labianca, and Stephen A. Rishton, "Water Soluble Conducting Polyanilines: Applications in lithography," J. Vac. Sci, Technol. B. 11(6), Nov./Dec. 1993, pp. 279–283.

"Journal of Vacuum Science & Technology B," Second Series, vol. 7, No. 6, Nov./Dec. 1989, pp. 1519–1523.

Marie Angelopoulos, Jane M. Shaw, and Kam–Leung Lee, Wu–Song Huang, Marie–Annick, Lecorre, and Michel Tissier, "Lithographic applications of conducting polymers," J. Vac. Sci. Technol. B 9(6) Nov./Dec. 1991, pp. 3428–3431.

Shimshon Gottesfeld, "Francisco A. Uribe, and Steven P. Armes, The Application of a Polypyrrole Precoat for the Metallization of Printed Circuit Boards," J. Electrochem, Co., vol. 139, No. 1, Jan. 1992, The Electrochemical Society, Inc., L14–L15.

POLYPYRROLE

POLYPYRROLE

METHOD OF MANUFACTURING PASSIVE ELEMENTS USING CONDUCTIVE POLYPYRROLE FORMULATIONS

This application is a continuation-in-part of U.S. patent application Ser. No. 08/491,625 now U.S. Pat. No. 5,545,308 filed on Jun. 19, 1995 and U.S. patent application Ser. No. 08/492,235 pending, filed on Jun. 19, 1995.

This invention was made with government support under contract F29601-94-C-0097 awarded by the Air Force. The government has certain rights in this invention.

FIELD OF THE INVENTION

The present invention relates to conductive polymers and their use in electronic applications. More particularly, the present invention relates to photosensitive solutions of pyrrole and direct metallization processes for preparing electronic circuits on non-conducting substrates. Even more particularly, the present invention relates to the preparation of passive electronic circuit elements such as resistor networks, inductors, and capacitors suitable for implementation into printed wiring boards (PWBs) and multichip modules (MCMs) through multilayer photopolymerization of conducting polymer films.

BACKGROUND OF THE DISCLOSURE

Printed wiring boards (PWBs) consist of non-conducting substrates, such as fiberglass/epoxy or polyimide, on which conducting circuits are deposited and discrete passive elements may be mounted. Multichip modules (MCMs) are devices that consist of a collection of integrated circuit (IC) chips or die that are mounted on a high-density interconnect substrate, such as alumina, with a high utilization ratio of die area to substrate area (up to 90–95%). The advantages of MCM technology over conventional packaging schemes, such as printed wiring boards, include very high packaging densities, clock speeds in excess of 500 MHz, lower power due to reduced capacitance, higher reliability, and better thermal matching of the die to the substrate material. The current disadvantages include the high cost of substrates, limited availability of bare die, and difficulties in testing at high clock speeds.

An important requirement for virtually every PWB and MCM application today is extremely high reliability. A demanding series of accelerated life tests, including moisture resistance, salt atmosphere, thermal shock, thermal cycle, constant temperature bake, lead integrity, and fine and gross leak tests, are usually performed on assembled PWBs and MCMs. Since semiconductor die are the major building blocks of an MCM, the first focus of yield, testability, and diagnostic evaluation must be at the die level (KGC concept of a "known good die"). However, performance analysis must be done for each product level (die, MCM, and system) and for each test condition.

A substantial number of different approaches are used by various vendors in the field. For example, MCMs are often classified according to the substrate technology (e.g. MCM-L, -C, and -D) which determines the possible interconnect density. The complexity of MCM design is reflected in the accepted definitions of the types of modules being offered to electronics manufacturers.

The use of a wide variety of processes has resulted in a lack of standardization which complicates the selection of substrates, choice of interconnection, and passive element integration technology. Thus, passive components (e.g., resistors, capacitors, inductors) are often attached discretely to the previous level of assembly. The insertion of low-profile passive components into PWBs and MCMs is costly, laborious and time consuming. Processes compatible with existing technologies which are able to incorporate the fabrication of passive elements into existing technologies are needed.

In hybrid and MCM technologies, passive components are produced by thin films (<5 $\mu$m), thick films (>10 $\mu$m) or may be discretely attached to the substrate, e.g. chip-resistors and chip-capacitors. Discrete passive components are less desirable because of laborious insertion of the components into the MCM circuit, and their use is limited to special conditions where very low or high values are needed.

Thin film technology is based on the deposition of passive elements by electron-beam, evaporation or sputtering. Thin film resistors may be nickel-chromium, tantalum nitride, or silicon carbide films; and dielectrics include silicon monoxide, silicon dioxide, and tantalum oxide. In thick film technology, inks or pastes are screen printed to the ceramic substrate. The resistive components of resistor pastes may comprise: ruthenium oxide, thallium oxide, indium oxide, mixtures of precious metals or tungsten-tungsten carbide. Dielectric materials are largely based on the ferroelectric ceramic barium titanate with various additives and glass-ceramic mixtures.

Electronically conducting polymers have often been categorized as non-processable and difficult to manage or manipulate, because of their insolubility in the conducting form. Only recently has it been shown that polymers such as polyaniline can be dissolved using functionalized sulfonic acids. For polypyrrole, this can be achieved by using its derivatives [e.g., poly (3-octylpyrrole)] which are known to be soluble in different solvents, or by treatment in dilute aqueous sodium hypochlorite solutions, ammonia or mono-, di- or tri-substituted amine (co)solvents. Another method of solubilizing polypyrrole is the process of polypyrrole chain deprotonation in basic solutions, which causes a transformation of conducting polypyrrole into a non-conducting polymer of quinoid structure.

The lack of processability of conducting polymer materials, e.g., solution or melt processing, infusability and poor mechanical properties, e.g., ductility, have slowed down their emerging commercial applications. While electrochemical preparation of conducting polymers has been shown to be the most satisfactory process from the viewpoint of fundamental investigations, it is likely to be inappropriate for the large-scale industrial production of bulk quantities of these materials. This is particularly true where large molecular entities, e.g., copolymers or different additives, need to be incorporated into conducting polymer matrices in order to obtain tailored performance characteristics.

Consequently, there remains a need for improved methods of manufacturing passive electronic elements in both printed wiring boards and multichip modules. It would be desirable to have a conducting polymer that avoids polymer solubility problems, can easily incorporate additives to obtain desirable characteristics such as flexibility and photoinitiation, minimizes hazardous chemicals, requires fewer process steps to apply/deposit/coat a workpiece, facilitates increased conductor densities on a substrate surface, and allows for passive electronic elements to be formed directly on the substrate. Furthermore, it would be desirable to have a method of manufacturing printed wiring boards and multichip modules having increased interconnect densities, improved manufacturability and improved product quality.

SUMMARY OF THE INVENTION

The present invention provides a method of forming an electronically conducting polymer resistor on a conducting or nonconducting substrate surface. Resistors are formed by applying a thin film of a formulation comprising pyrrole monomer and a salt onto the substrate surface. The salt consists of an electron acceptor containing $Ag^+$ cations and a dopant anion selected from the group consisting of $NO_3^-$, $NO_2^-$, $BF_4^-$, $ClO_4^-$ and tosylate. A portion of the film is then photopolymerized to form a resistor by exposure to ultraviolet light, laser light or an electron beam, while the unpolymerized portion of the film is removed from the substrate with a solvent. The pyrrole:salt molar ratio in the formulation is greater than about 0.5, and the resistor has an electrical resistance substantially determined by the molar concentration of the salt in the formulation.

The present invention also provides a method of forming a plurality of electronically conducting polymer resistors having different electrical resistances on a common substrate surface. The method involves preparing a plurality of formulations comprising a monomer and a salt, wherein the salt consists of an electron acceptor consisting of $Ag^+$ cations and a dopant anion selected from the group consisting of $NO_3^-$, $NO_2^-$, $BF_4^-$, $ClO_4^-$ and tosylate, and wherein each of the formulations has a different molar concentration of salt for forming resistors having resistances within a given range. A thin film of a formulation is then applied onto the substrate surface before photopolymerizing a portion of the film to form a resistor. The photopolymerized portion extends between two contact points and has sufficient thickness and width so that the overall electrical resistance between the two contact points is somewhat less than a resistance specified for that resistor. The unpolymerized portion of the film is removed from the substrate with a solvent. These steps are repeated for each of the plurality of formulations. Heat may be applied to the resistor to provide a thermal cure.

The methods may also include the steps of measuring the overall resistance of a resistor and increasing the overall resistance of the resistor up to a specified resistance by trimming the resistor with a laser. These steps may be repeated until each resistor has an overall resistance near the resistance specified for that resistor.

The present invention further provides a method of forming an electronically conducting polymer inductor on a nonconducting substrate surface. After preparing and applying a formulation, as set out above, a plurality of lower horizontal lines are photopolymerized in the film. The unpolymerized portion of the film is removed from the substrate with a solvent and a layer of dielectric material is deposited over the lower horizontal lines to form a top surface of the structure. Holes are drilled downward through the layer of dielectric material and into each end of each lower horizontal line before applying a thin film of the formulation to the holes and top surface of the dielectric material. The film is selectively pliotopolymerized to form vertical vias and upper horizontal lines, wherein the ends of each upper horizontal line connect with the vertical vias, and wherein the upper horizontal lines, lower horizontal lines and vertical vias are electronically conducting and cooperate to form a coil-like pathway.

The present invention also provides a method of forming a solid state electrolytic capacitor in which a conducting polymer is applied as an electrolyte. A thin film of a formulation is deposited on a dielectric layer. A portion of the film is photopolymerized and the unpolymerized portion of the film is removed from the substrate. A layer of palladium is then deposited onto the surface of the photopolymerized polymer by immersion in solution consisting of a palladium containing salt, followed by electrodeposition of a metal conductor layer such as gold, copper or platinum, on the palladium layer.

The present invention encompasses a method of forming a plurality of passive elements on a common substrate surface. This method includes the steps of preparing a formulation, as set out above, forming an electronically conducting polymer resistor on a conducting or nonconducting substrate surface, forming a solid state electrolytic capacitor in which a conducting polymer is applied as an electrolyte, and forming an electronically conducting polymer inductor on a nonconducting substrate surface.

DETAILED DESCRIPTION OF THE PREFERRED EMBODIMENT

The present invention provides a novel photopolymerization process for the preparation of high-quality, passive electronic elements using electronically conducting organic polymer films. The process utilizes a simple formulation that consists of a pure monomer (such as pyrrole or aniline), a salt and a solvent. Polymerization is induced by light allowing thin polymer patterns to be photopolymerized on typical PWB substrates, such as fiberglass/epoxy or polyimide, and MCM substrates, such as alumina ($Al_2O_3$), berillia (BeO), fiberglass/epoxy, silicon, polyimide and ceramic-filled polytetrafluoroethylene.

Direct writing of patterns can be performed with an argon laser or by electron beam irradiation for improved resolution. When photopolymerizing electronically conducting polymer dry-film photoresists, a contact mask having a desired pattern inscribed therein can be placed over the substrate to block out light from undesired areas. The mask/board assembly is then exposed to UV (or electron beam) irradiation, promoting photopolymerization of the cast formulation (or dry film) in regions where light passes through the pattern inscribed in the mask. The photopolymerizable thin film formulation not exposed to the radiation can then be removed by means of an appropriate solvent.

The formulations of the present invention include a salt that serves both as an electron acceptor for oxidation of the monomer(s) and as a dopant to preserve electroneutrality in the oxidized polymer. Preferred electron acceptors undergo very slow oxidation of the monomer in the dark (1–2 days) and have the highest conductivities.

Polypyrrole (PPY) can be chemically prepared using inorganic ($Fe^{3+}$ and $Cu^{2+}$ ions) or organic (chloranil) electron acceptors. When inorganic acceptors are added to pyrrole-containing solutions a powdery polymer material results almost immediately after the addition. Therefore, cations having too high an oxidation potential are not suitable for photopolymerization of polypyrrole. Several attempts were made to use organic electron acceptors, but photopolymerization of black conductive PPY films was unsuccessful. It has been shown that electron acceptors with proper oxidation potential (e.g. $Ag^+$, $Fe^{3+}$ or $Cu^{2+}$ ions) and dopant (e.g. $NO_3^-$, $BF_4^-$, tosylate, etc.) play a decisive role in determining the conductivity of the conducting polymer film. The preferred electron acceptors are the silver salts (such as $AgNO_3$, $AgClO_4$ and $AgNO_2$), with the most preferred being silver nitrate, $AgNO_3$.

Figure 2:
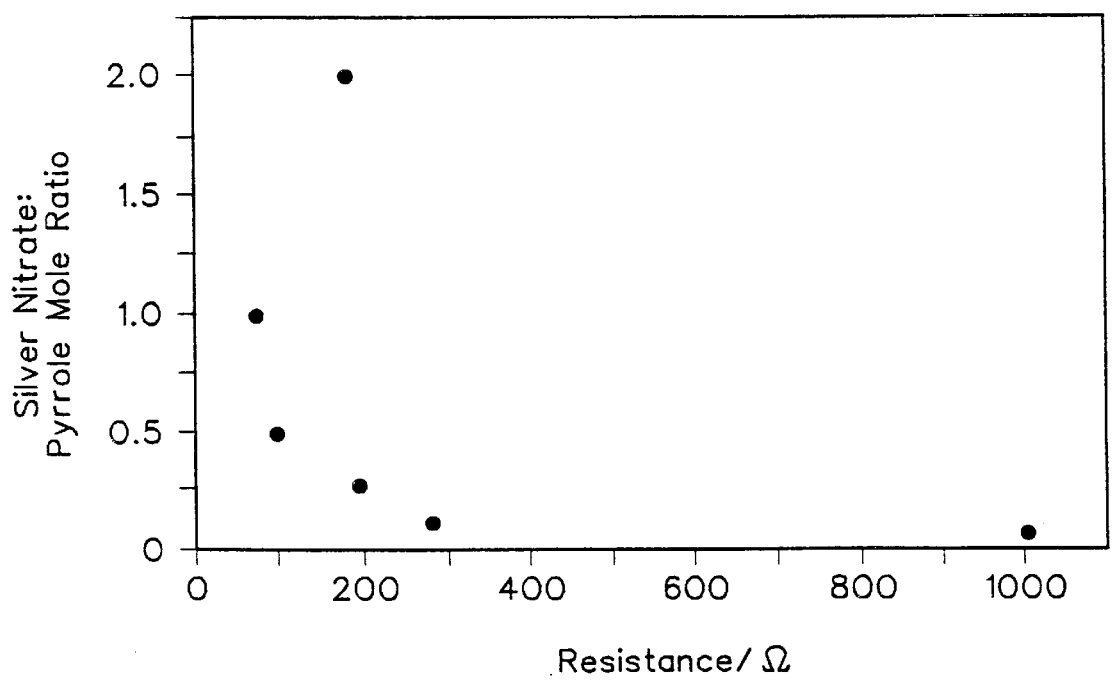
FIG. 2 is a graph illustrating the dependence of electrical resistance of photopolymerized polypyrrole films on the electron acceptor:monomer mole ratio in the starting formulation.

The conductivity (or resistivity) of a polymer film can be modified by changing the molar ratio of monomer to electron acceptor over a wide range. FIG. 2 shows the resistance of conducting polymer films at various ratios of monomer to electron acceptor above about 0.5. Monomer/electron acceptor ratios ranging between about 2 and about 100 are preferred for producing electronically conductive polymer films. The electrical conductivity of the polymers decreases (resistance increases) with decreasing concentration of electron acceptor (increasing monomer to electron acceptor ratio). High electron acceptor concentrations, such as monomer/electron acceptor molar ratios below about one, have been found to produce films that are thicker than desirable.

A polymer network can be formed by promoting the polymerization of a monomer, oligomer, or mixtures of monomers and/or oligomers. Polymerization is a chain reaction that can develop very rapidly, especially when intense UV radiation is used to produce the initiating species. This UV-curing reaction leads ultimately to a three-dimensional polymer network. Since most of the monomers or oligomers commonly employed do not produce initiating species with a sufficiently high yield upon UV exposure, it is preferred to introduce a photoinitiator that will allow the polymerization to start. A typical UV-curable formulation, therefore, will contain two basic components: (i) a photoinitiator, and (ii) a monomer, oligomer, or a mixture of monomers and/or oligomers.

The choice of the photoinitiator is of prime importance in light-induced polymerizations, since it directly governs the cure rate. A suitable photoinitiator system must possess high absorption in the emission range of the light source. The photoinitiator must also form an excited state having a short lifetime to avoid quenching by oxygen or the monomer and split into reactive radicals or ionic species with the highest possible quantum yield. Other factors to be considered in selecting the proper photoinitiator include solubility in the monomer, storage stability and the nature of the photoproducts, which should not be colored, toxic or induce some degradation of the polymer upon aging. Photoinitiators can be classified into three major categories, depending on the kind of mechanism involved in their photolysis: (i) radical formation by photo-cleavage; (ii) radical generation by hydrogen abstraction, and (iii) cationic photoinitiators.

Cationic photoinitiators have proven to be particularly useful in the photopolymerization of polypyrrole from pyrrole monomers in solution. Besides their specificity, cationic-initiated photopolymerizations have the advantage of being insensitive to atmospheric oxygen. In the absence of nucleophilic reagents, the chain reaction will thus continue to develop after the illumination has ceased and provide a beneficial post-cure effect that can be enhanced by thermal treatment. The preferred post-photopolymerization thermal treatment involves heating the polymer at temperatures between about 80 and about 120 degrees Celsius for about three hours, with the most preferred temperature being about 100 degrees Celsius.

Thermally stable photoinitiators for cationic polymerizations of commercial significance include the onium salts, such as triarylsulfonium and diaryliodonium, with complex metal halide anions. A key feature of these photoinitiators is the low nucleophilicity of the anions which reduces termination processes and allows ambient temperature cationic polymerization to proceed. The absence of air inhibition represents a distinguishing feature of cationic, as compared to radical, polymerization.

The photoinitiators investigated include a titanocene radical photoinitiator (such as IRGACURE™ 784 available from Ciba Geigy, located in Ardsley, N.Y.), a cationic ferrocinium photoinitiator (such as a (h6-benzene)(h5-cyclopentadienyl) iron(II)-hexafluorophosphate available as IRGACURE™ 261 from Ciba Geigy, located in Ardsley, N.Y.), triaryl sulphonium $PF_6^-$ salts (such as CYRACURE™ 6990, available from Union Carbide, located in Danbury, Conn.), triaryl sulphonium $SbF_6^-$ salts (such as CYRACURE™ 6974, available from Union Carbide, located in Danbury, Conn.). The photoinitiators are preferably added to the monomer in amounts less than about 8 weight percent, with the most preferred amounts being between about 0.2 to about 0.8 weight percent.

Photopolymerization of pyrrole alone, or pyrrole mixed with a photoinitiator such as titanocene, yields a transparent yellow film exhibiting insulating properties. Resistances of over 20 MΩ are measured by an ohmmeter. When $AgNO_3$, an electron acceptor, is dissolved into the pyrrole prior to curing, a black polymer film characteristic of conducting polypyrrole is formed.

In general, both electropolymerized and photopolymerized polypyrrole films suffer from poor mechanical properties. They lack flexibility, either as stand alone films or as coatings. Three approaches have been found to improve the mechanical properties of photopolymerized polypyrrole: (i)

incorporating large amphophilic (surfactant) organic anions into the polypyrrole structure, (ii) photo-copolymerizing a suitable comonomer material with pyrrole, and (iii) including commercial flexibilizers. The preferred surfactants are large anionic surfactants, such as the sodium salts of dodecyl sulfate (DDS) and dodecylbeizene sulfonate (DDBS). The preferred comonomer is aniline. The preferred flexibilizer is polyethylene glycol diglycidyl ether.

In accordance with the present invention, formulations can include a mixture of monomers which can be photopolymerized to form copolymers. While photo-copolymerizations can be achieved with many monomer pairings, the preferred monomer pairs for the lithographic production of an electronically conducting copolymer on a non-conducting substrate are comprised of: (i) pyrrole in combination with: (ii) a sub-stoichiometric amount of silver nitrate (such as a molar ratio of pyrrole to silver nitrate of about 8:1) and with (iii) fifteen mole percent aniline relative to pyrrole. The mixed monomer formulation is then diluted with an equivalent volume of acetonitrile to provide good contact with the substrate.

The components of photopolymerizable solutions are mixed in a glass vial that excludes the penetration of light. The solutions are then sonicated to facilitate dissolution and homogenization of the formulation. Since a slow chemical polymerization of pyrrole takes place over a period of one to two days in the presence of $Ag^+$ ions, it is preferred that fresh photopolymerizable formulations be prepared immediately prior to polymerization.

A thin layer of the formulation is then cast and evenly spread on the surface of a selected substrate typically having a surface area of between about 1 and about 4 square centimeters ($cm^2$). The preferred methods of spreading the formulation over the substrate to achieve a thin layer having uniform thickness include brush coating, spraying, dipping and spin coating, with the most preferred method being spin coating.

After casting of the photopolymerizable solution onto a substrate and formation of an air-dried nonconducting film, the oxidation process is initiated by irradiation. The preferred irradiation methods are those which selectively expose only discrete regions or lines on the coated substrate, such as exposure by ultraviolet light through a contact mask, direct laser imaging, or electron beam imaging. Using these methods, thin polymer patterns (lines and through-boles) are readily polymerized on various conducting and nonconducting substrates. Multiple coating-curing cycles (providing up to 10 layers) can be carried out in order to produce thick uniform films.

Photopolymerizations according to the present invention can be accomplished with a 200-Watt mercury-xenon lamp focused through a lens vertically downward onto a circular area of less than one centimeter in diameter. All the optical accessories should be made of fused silica in order to allow high energy UV as well as visible light to pass therethrough.

The present invention uses the radiation as the driving force to induce electron transfer from the monomer species in a cast solution film to the electron acceptor, also present in the formulation. As the concentration of oxidized monomer increases, coupling between the oxidized monomer units begins. This process continues, resulting in growth of the conducting polymer chains. Since the polymer is oxidized, the anion present in the formulation intercalates into the polymer, maintaining electroneutrality.

The photopolymerization process does not require a conducting substrate for deposition to take place, and conducting polymer films and/or lines of various thickness, typically between about 5 and about 300 microns can be readily photopolymerized on typical PWB substrates (e.g., fiberglass/epoxy, polyimide) and MCM (e.g., alumina) as well as on metals, ceramic, silicon, GaAs, glass, paper, Teflon, Mylar and polystyrene substrates. The process of the present invention is much simpler than techniques known in the art and offers a high potential and flexibility for adaptation to a variety of PWB technologies.

The photopolymerization process of the invention includes the following steps:

(i) a photopolymerizable formulation is applied on a substrate;

(ii) after air-drying, a dry negative prepolymer film is exposed to laser light, an electron beam or to a UV lamp through a shadow mask;

(iii) the illumination induces photopolymerization of the prepolymer film at exposed areas rendering the exposed areas insoluble; and (iv) the non-polymerized (non-illuminated) areas are washed off with an environmentally safe solvent (acetone) or water, leaving a pattern of conducting polymer lines.

The main advantage of the photopolymerization process, compared to electrochemical and/or chemical polymerizations, is that it allows properties of conducting polymer films to be easily designed and optimized by incorporating molecular species into the polymer structure. For example, it is possible to change the conductivity of the polymer by controlling the amount of the electron acceptor and dopant anions present in the formulations. The same oxidatively coupled cationic polymer is formed through photopolymerization as through electrochemical polymerization, except that the anion/monomer ratio is much higher (1:1.3) compared to that found in electrochemically formed films (1:4). This is a desirable feature because with more anions in the polymer matrix, more charge can be introduced onto the polymer chains and, consequently, higher conductivities may be achieved.

EXAMPLE 1

A separate investigation involving both photopolymerization and thermal polymerization processes was performed on samples having two different electron acceptor salts, $AgNO_3$ and AgTs, at rather low concentrations (pyrrole:electron acceptor=50:1). Four samples were cured at the same time either thermally or by photopolymerization. Curing times were determined by observing the solidification of the surface and by applying a simple pencil hardness test, often used in the polymer coating industry for semi-quantitative determination of curing quality. The results are summarized in Table 1.

Thermally cured polymer films, either with $AgNO_3$ or AgTs as an electron acceptor, were of very poor quality, rough and lacked a uniform color, indicating nonhomogeneous polypyrrole films. Thermal curing of the first layer proceeded with incomplete coverage of the exposed substrate surface and curing resembled that of simple drying of the solution. On the other hand, photopolymerization of the first layer resulted in a completely covered substrate surface. When more layers were added, curing times became longer, because of the penetration of freshly added formulation into the existing layers. Curing times for films where silver tosylate was added as the electron acceptor salt were longer than for $AgNO_3$-containing samples. This was expected, because diffusion of larger (organic) anions into polymer films being formed (in order to satisfy the neutrality of an oxidized polymer) is much slower than for smaller anions, like nitrates. Thermal curing required curing times 2–3 times longer than the process of photopolymerization. This is evident especially where tosylates are used as electron acceptors.

In experiments performed involving different substrates it was found that comparisons between photopolymerized polypyrrole films were best achieved if polystyrene was used as the substrate, and if the films under investigation were cured at the same time, which assured the same curing

TABLE 1

Comparison of photopolymerized and thermally polymerized polypyrrole films
(pyrrole/electron acceptor molar ratio was 50:1; Photoinitiator: 3 wt % IRGACURE ™ 261)

| LAYER NUMBER | ELECTRON ACCEPTOR | AgNO₃ | | AgTs | |
|---|---|---|---|---|---|
| | | PHOTO-POLYMERIZED | THERMALLY POLYMERIZED | PHOTO-POLYMERIZED | THERMALLY POLYMERIZED |
| FIRST LAYER | CURE TEMPERATURE °C. | 68 | 69 | 68 | 69 |
| | CURING TIME min | 2 | 3.5 | 3 | 18 |
| | POLYMER FILM APPEARANCE | smooth, black, brittle | incomplete coverage, gray-black, rough, brittle | smooth, green-black, brittle | incomplete coverage, gray-green black, rough, brittle |
| FIFTH LAYER | CONDUCTIVITY S cm⁻¹ | $9.7 \times 10^{-3}$ | $3.8 \times 10^{-2}$ | $4.1 \times 10^{-4}$ | $6.0 \times 10^{-5}$ |
| | CURE TEMPERATURE °C. | 68 | 68 | 67 | 68 |
| | CURING TIME min | 7 | 8 | 9 | 20 |
| | POLYMER FILM APPEARANCE | smooth, black, brittle | gray-white-black, rough, brittle | smooth, green-black, brittle | gray-white-black, rough, brittle |

From the results of this experiment it is evident that the photochemical polymerization process proceeds faster than thermal polymerization and produces more smooth and uniform polypyrrole films. The thermal polymerization process is obviously different in nature, possibly based on a chemical polymerization mechanism at elevated temperatures, leading to the formation of a partially silver-filled non-conducting polypyrrole matrix.

EXAMPLE 2

Figure 1:
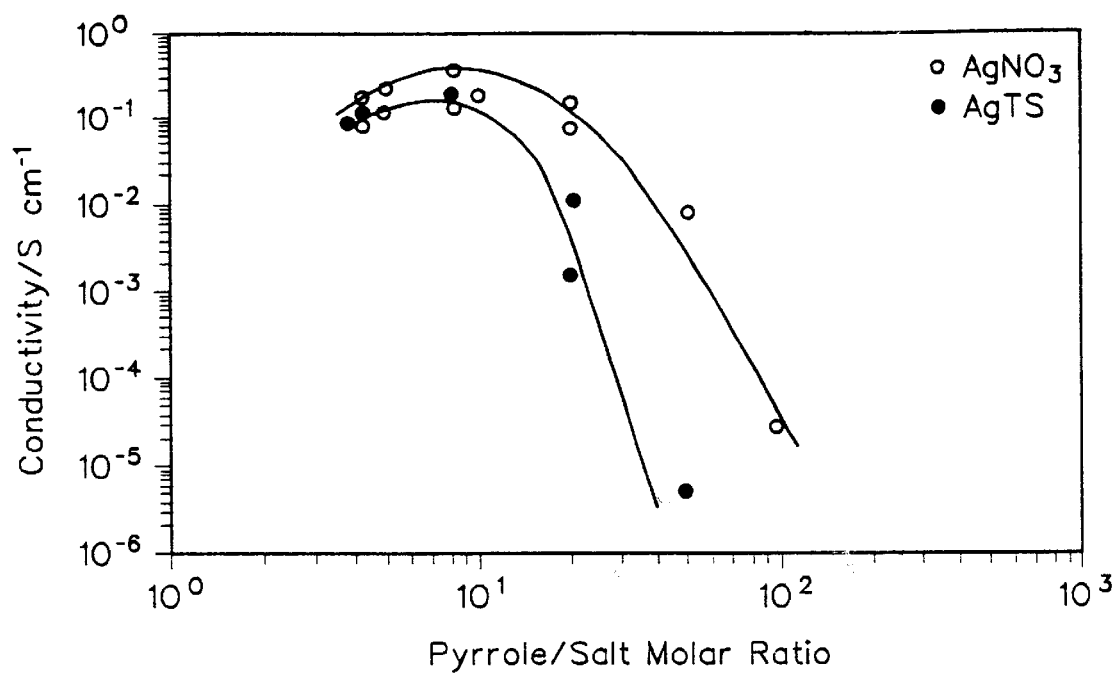
FIG. 1 is a graph illustrating the dependence of conductivity on the type and concentration of dopant anions present in photopolymerizable polypyrrole-based formulations.

In order to improve the mechanical properties of PPY films three different electron acceptor salts were investigated: $AgNO_3$, AgTs and $AgBF_4$. It has been reported that incorporation of tosylate anions improves the mechanical properties of electrochemically formed PPY films. Thus, these three electron acceptor salts were added to photopolymerizable formulations using pyrrole:acceptor molar ratios ranging from 100:1 to 4:1, the latter being closest to the ratio of pyrrole monomer to positive charge found in electrochemically polymerized films. FIG. 1 shows the dependence of electrical conductivity on the concentration of electron acceptors ($AgNO_3$ and AgTs) added to the formulations. Both curves exhibit a maximum conductivity value of approximately 0.1–0.3 S cm⁻¹ at pyrrole:salt molar ratios between about 3:1 and about 8:1. A steep decrease in conductivity occurred at molar ratios higher than 15:1. In the case of AgTs, at low added salt concentrations, the conductivities were several orders of magnitude lower than those for polymer films photopolymerized with $AgNO_3$. The data shown in FIG. 1 includes films of different thicknesses, where all of them were photopolymerized and then peeled off from Al substrates. Although the thinner films were less brittle and less fragile, no improvement in mechanical properties was observed for films photopolymerized with tosylates.

conditions. Polystyrene showed satisfactory wettability for a whole range of film compositions used.

In Table 2, results are given for PPY films photopolymerized using different silver salts, and their mixtures, added at pyrrole:salt molar ratios of 8:1. All the films yielded conductivity values within an order of magnitude of each other (approximately 0.1 to 0.4 S cm⁻¹), except in the case of $AgBF_4$ which displayed a conductivity value two orders of magnitude lower. $AgBF_4$-containing films possessed the poorest mechanical properties, and required the longest curing times for complete curing. When mixed with $AgNO_3$ in equimolar concentrations, but keeping the total pyrrole/salt ratio constant (8:1), the conductivity of polypyrrole films improved and approached the values measured for $AgNO_3$ alone.

From the data presented in FIG. 1 and Table 2, it was concluded that $AgNO_3$ added to photopolymerizable formulations in amounts corresponding to 10–15 mol %, provide the necessary electron acceptor properties for photopolymerization to take place, and gives the amount of $NO_3^-$ anions required for charge balance inside the polymer. Thus, $AgNO_3$ is the optimal choice of electron acceptor for the photopolymerization of pyrrole.

TABLE 2

Conductivity of photopolymerized PPY films containing different anions (Electron acceptor: $Ag^+$; Photoinitiator: 3 wt % IRGACURE ™ 261; pyrrole/salt ratio = 8:1).

| ELECTRON ACCEPTOR SALT | STAND ALONE FILMS | | FILMS ON POLYSTYRENE | |
|---|---|---|---|---|
| | CONDUC-TIVITY $S\ cm^{-1}$ | THICK-NESS $\mu m$ | CONDUC-TIVITY $S\ cm^{-1}$ | THICK-NESS $\mu m$ |
| $AgNO_3$ | 0.425 | 62 | 0.158 | 34 |
| AgTs | 0.197 | 88 | 0.179 | 53 |
| $AgBF_4$ | | | 0.0018 | 57 |
| $AgNO_3$\AgTs | 0.212 | 168 | | |
| $AgNO_3$\$AgBF_4$ | 0.375 | 51 | | |

EXAMPLE 3

A series of experiments were performed to examine the electrical resistance of photopolymerized polypyrrole films as a function of monomer/electron acceptor mole ratio in the starting formulation. A mole ratio range of 20:1 to 0.5:1 (pyrrole:silver nitrate) was investigated. The solutions were prepared in one ml of pyrrole monomer and varying amounts of silver nitrate. Pyrrole films of constant thickness (ca. 60 microns) were produced. A minimum resistance (Van der Pauw method) of about 80 Ω was observed at a 1:1 mole ratio of monomer to silver nitrate. Results shown in FIG. 2 demonstrate that by simple adjustment of the concentration of starting formulation components (monomer and electron acceptor) a change in resistance can be obtained.

EXAMPLE 4

Simple tests of thick film curing were performed by simultaneous illumination of formulations containing photoinitiators added at 3 wt % to an 8:1 pyrrole:$AgNO_3$ solution. Exposure to UV light was brought about from the top of miniature glass vials (0.7 cm dia. and 1.1 cm height) containing different photoinitiators. The process of photopolymerization was closely followed under low illumination conditions (corresponding to a temperature of 30°–32° C.), in order to determine the changes taking place during photopolymerization. In all four vials the polymerization process went through different stages which affected the color of the bulk and/or surface layers of the formulations and the speed of solidification. From this simple experiment it was observed that cationic photoinitiators exhibited faster curing rates than radical photoinitiators. Especially, IRGACURE™ 261 demonstrated better curing (in line with weak absorption of 366 nm light), as evidenced by a deeper and more homogeneous blackening and solidification of the entire formulation volume in the glass vial.

Although the choice of photoinitiator between triarylsulfonium salts and the ferrocinium photoinitiator, all three being cationic photoinitiators, was not conclusive, the ferrocinium photoinitiator is more suitable for photopolymerization of pyrrole because it allows deeper light penetration through the black solidified surface layer. Ferrocinium photoinitiators have been found to be successful for the photopolymerization of epoxides, which have been used in this work as potential copolymers with polypyrrole.

Figure 3:
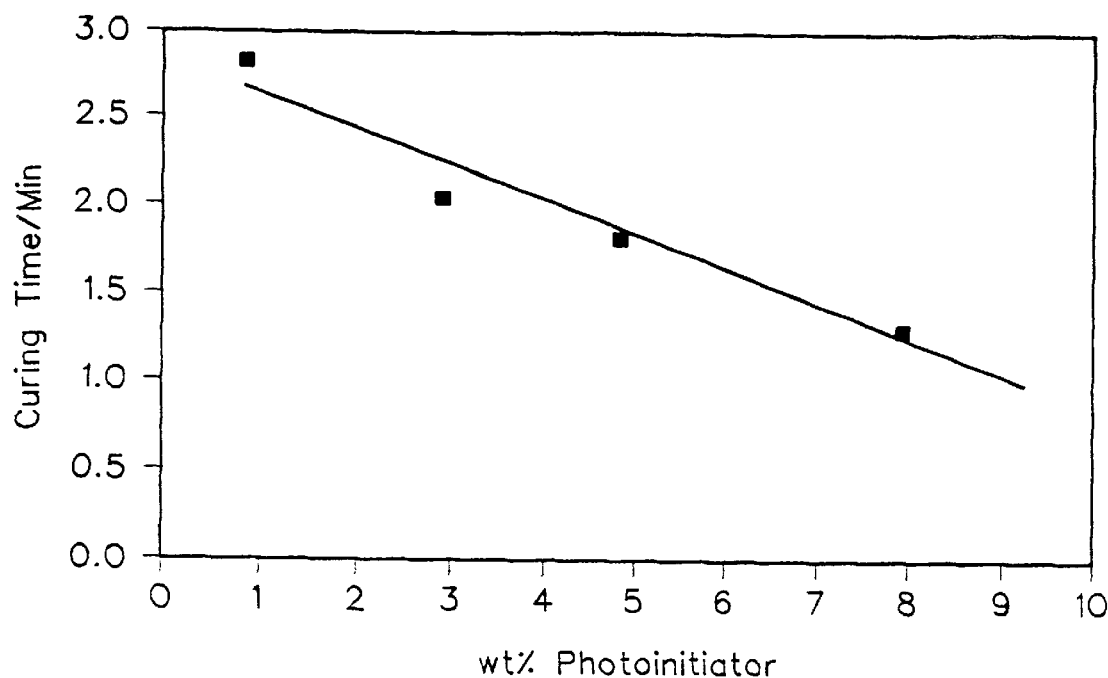
FIG. 3 is a graph illustrating the dependence of curing time on the concentration of photoinitiator.
Figure 4:
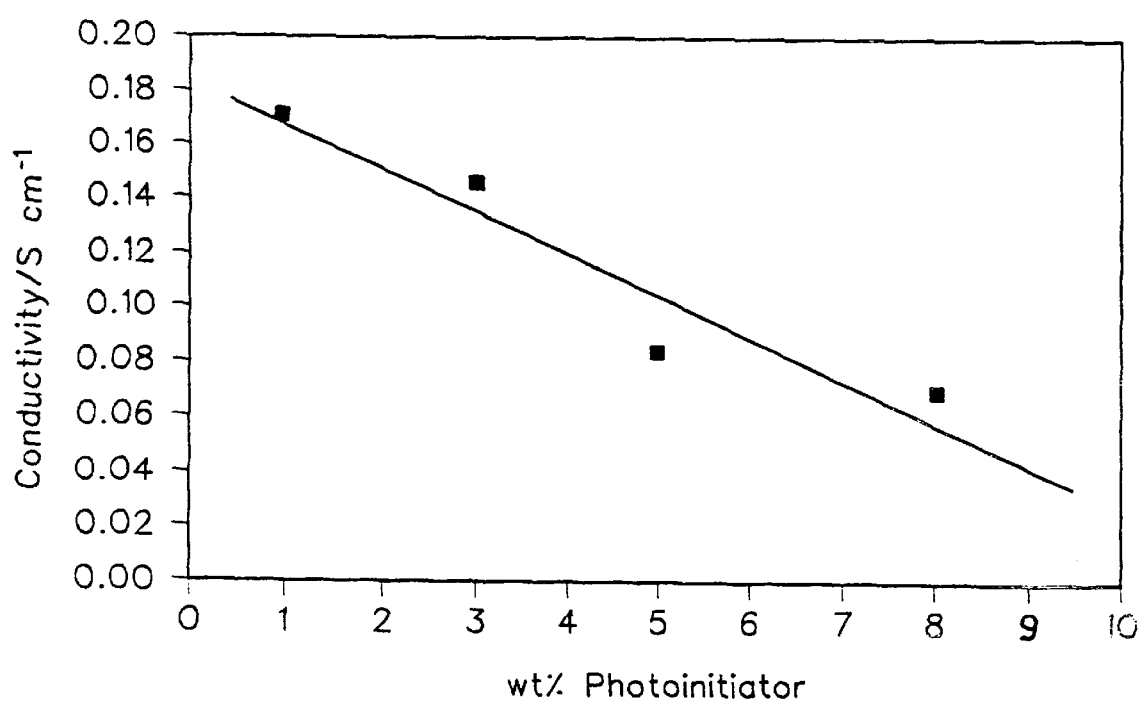
FIG. 4 is a graph illustrating the dependence of conductivity on photoinitiator concentration.

The effect of ferrocinium photoinitiator concentration on the curing time of PPY films is shown in FIG. 3. Formulations containing increasing amounts of photoinitiator were applied at different thicknesses on aluminum and glass substrates, and were cured simultaneously. Curing time was determined by observing solidification and by the pencil hardness test. Increasing the amount of photoinitiator from 1 to 8 wt % decreased the curing time by approximately a factor of two. FIG. 4 shows that increasing amounts of photoinitiator present in the films causes a slight decrease in conductivity.

EXAMPLE 5

Organic anions tested as film flexibilizing components were DDS (dodecyl sulfate, sodium salt) and DDBS (dodecyl-benzene sulfonate, sodium salt). They were added to the already optimized formulation to yield the highest conductivity, i.e., pyrrole:$AgNO_3$ ratio of 8:1 and 3 wt % of IRGACURE™ 261 photoinitiator. Amounts added to the formulation are expressed as pyrrole/surfactant molar ratios. Polypyrrole films were photopolymerized from these formulations under different illumination conditions and on various substrates. A post-cure thermal treatment at the highest lamp radiance was applied after photocuring. This is recommended by Ciba-Geigy for completion of curing processes when IRGACURE™ 261 photoinitiator is used.

Photopolymerization along the area of the substrate covered by the formulation was followed by observing black solidifying zones smoothly spreading across the surface of the substrate. It was evident that these additives helped diffusion of polymerizing components in the thin formulation layer. Curing was generally slower than for the films without surfactant additives. Films obtained showed a significant improvement in mechanical properties. They were very flexible compared to the films that did not contain surfactant additives. It was possible to bend these films, whether coated on an aluminum sheet or on polystyrene, through angles greater than 90° without breaking them. Additives acting as surfactants greatly improved the adherence of the film to the substrate. More importantly, films so formulated retained good conductivity. DDBS was less soluble in pyrrole and gave rise to films of lower flexibility when compared to films with DDS as an additive. Table 3 compares conductivities for DDS- and DDBS-containing films, added as pyrrole:surfactant molar ratios of 15:1.

TABLE 3

Conductivity of photopolymerized PPY films with large organic anions as flexibilizers (Pyrrole/$AgNO_3$ = 8:1; Pyrrole/surfactant = 15:1; photoinitiator: 3 wt % IRGACURE ™ 261; Curing time: fast, 1.9 W $cm^{-2}$ with thermal post-cure: 2.3 W $cm^{-2}$).

| ADDITIVE SUBSTRATE MATERIAL | DDS | | DDBS | |
|---|---|---|---|---|
| | CONDUC-TIVITY $S\ cm^{-1}$ | THICK-NESS $\mu m$ | CONDUC-TIVITY $S\ cm^{-1}$ | THICK-NESS $\mu m$ |
| STAND ALONE | 0.21 | 163 | 0.20 | 215 |
| STAND ALONE | 0.51 | 61 | 0.59 | 75 |
| STAND ALONE PY/$AgNO_3$ = 5/1 | 0.134 | 224 | | |
| POLYSTYRENE | 0.48 | 39 | 0.32 | 62 |
| POLYMER FILM APPEARANCE | smooth, black, curing time: 1.3 min/layer, very flexible | | smooth, black, curing time: 2 min/layer, flexible | |

Figure 5:
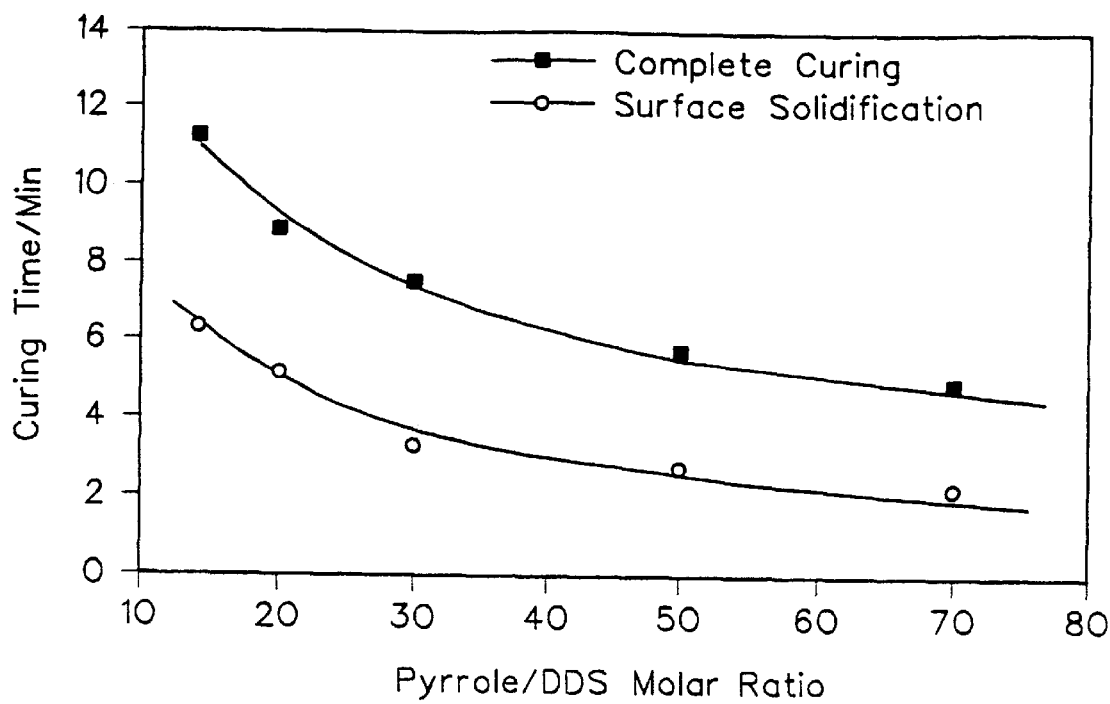
FIG. 5 is a graph illustrating the dependence of curing time on the amount of dodecyl sulfate used as flexibilizer.
Figure 6:
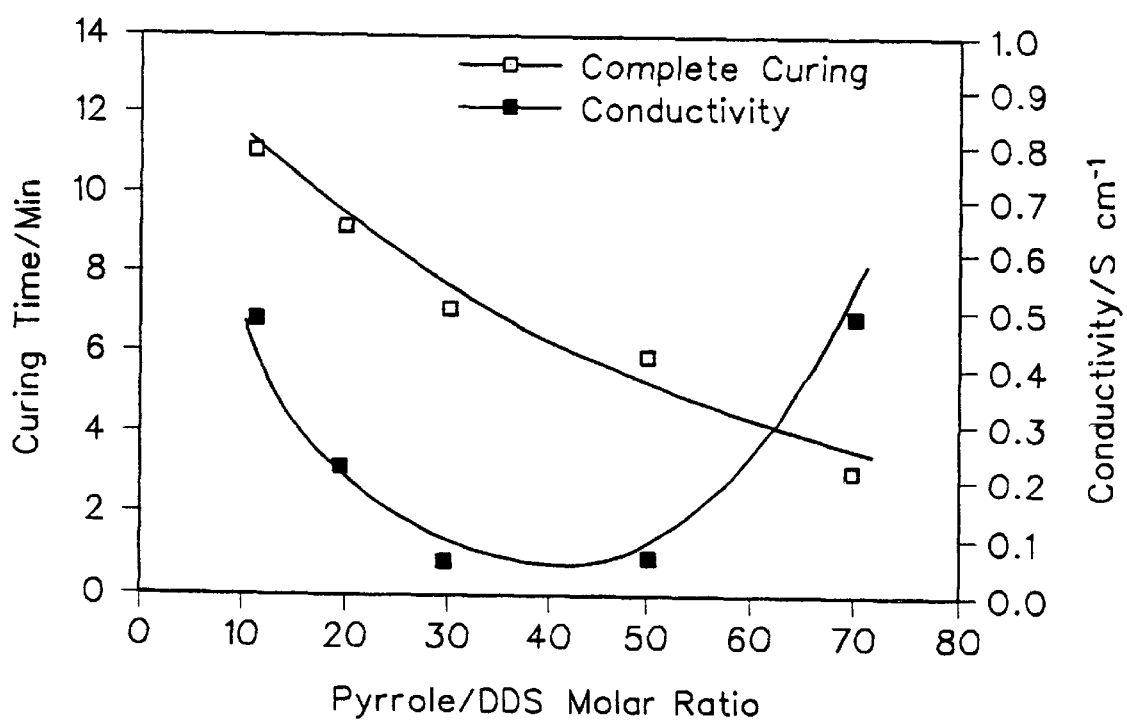
FIG. 6 is a graph illustrating the dependence of curing time and conductivity on the amount of dodecyl sulfate used as flexibilizer.

FIGS. 5 and 6 show variations in curing time and conductivity of films photopolymerized with different concentrations of DDS additive. It was possible to follow the curing progress at two stages:corresponding to surface solidification and when curing was completed. Both plots exhibit the same slope, showing that the curing time is longer with increasing amounts of DDS in the films. Films with higher concentrations of surfactant additive became soft. The electrical conductivity of the films was within the range 0.1–0.5 S cm$^{-1}$. Minimum electrical conductivity, evident at ratios between 30:1 to 50:1, is probably due to an artifact in that the resistivity probe tips penetrated into the soft films at ratios greater than 30:1 and hence, displayed conductivity values higher than those for the films of measured thickness.

EXAMPLE 7

A series of experiments were performed under the conditions described in Example 5, for various copolymer materials such as an aqueous acrylic resin, bisphenol A diglycidyl ether, and perfluorinated sulfonic acid. The results are given below in Table 4.

TABLE 4

Conductivity of PPY films photo-copolymerized with different resins (pyrrole/ AgNO$_3$ ≦ 8:1; photoinitiator: 3 wt % IRGACURE ™ 261; curing: different conditions; average 1.2 W cm$^{-2}$; for araldite 2.1 W cm$^{-2}$ and thermal postcure at 2.3 W cm$^{-2}$).

| COPOLYMER MATERIAL | % (w/w) OF COPOLYMER | THICKNESS μm | CONDUCTIVITY S cm$^{-1}$ | COMMENT |
|---|---|---|---|---|
| MAINCOTE HG 54 D | 50 (1:1) | | | no polym., yellow precipitate |
| MAINCOTE HG 54 D | 4 | 65 | 0.074 | black, smooth, max. copol. conc = 4 wt % |
| MAINCOTE HG 54 D | 4 | 119 | 0.072 | black, smooth, max. copol. conc = 4 wt % |
| ARALDITE 502 (on polystyrene) (on glass) | 10 | 121 | 0.086 | black, smooth, flexible |
| | 14 | 74 | 0.022 | longer curing needed |
| | 20 | 159 | 0.0092 | at high lamp power |
| | 14 | 41 | 0.063 | t > 10–15 min/layer |
| | 20 | 20 | 0.044 | t > 10–15 min/layer |
| | 34 | 14 | 0.015 | t > 10–15 min/layer |
| | 51 | 12 | 0.0068 | t > 10–15 min/layer |
| NAFION | 5 | 64 | 0.53 | black, smooth, flexible |
| | 10 | | | too resistive, voltage transients show saturation |

It was found that films containing between 10:1 and 20:1 of pyrrole:DDS additive, possess the greatest flexibility and conductivity.

EXAMPLE 6

A series of experiments were performed to examine the electrical resistance of polymer films photopolymerized from mixtures of pyrrole and aniline monomers. Solutions of silver nitrate (AgNO$_3$), pyrrole, and aniline were prepared in one ml of acetonitrile. Equivalent molar amounts of AgNO$_3$ and various proportions of pyrrole and aniline were prepared in a large volume excess of acetonitrile (about 500 volume percent).

Figure 7:
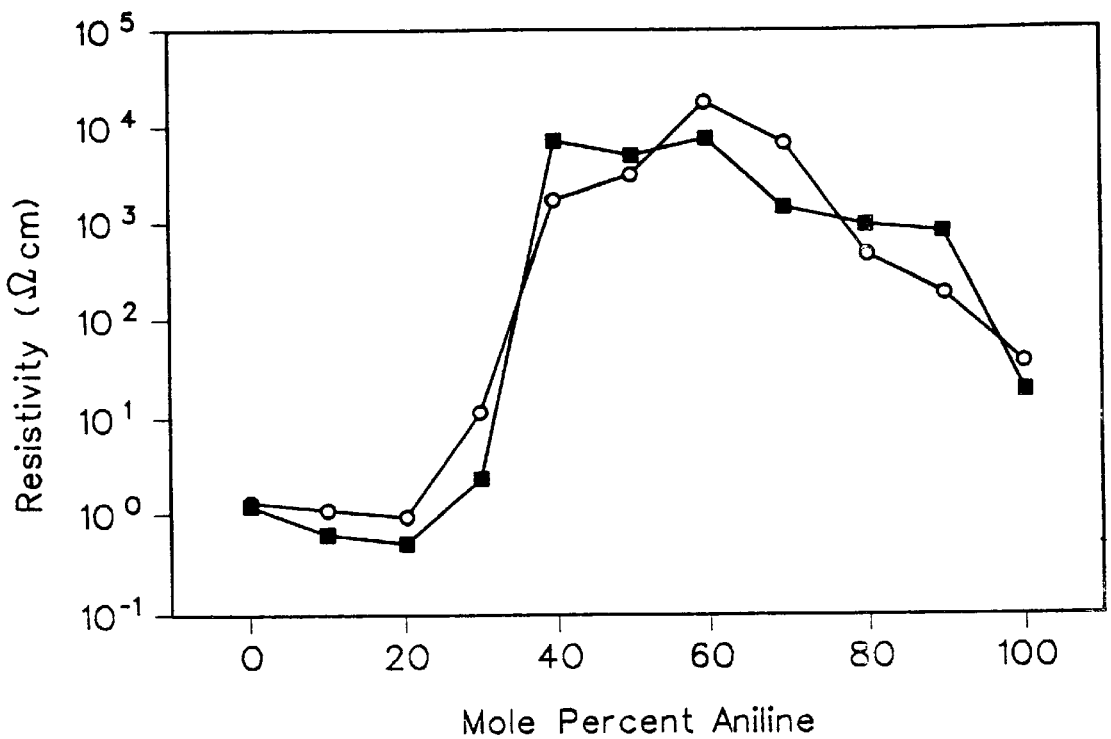
FIG. 7 is a graph illustrating the dependence of resistivity of photopolymerized polypyrrole films on the ratios of pyrrole:aniline monomers.

The solutions were deposited with a brush to coat a masked ceramic alumina substrate and cured immediately. Two to three successive layers were built up on the alumina with a thickness between 20 and 160 microns. The polymer samples were cured in 1 sq cm areas and contacts for resistance measurements were drawn with a silver paint. Resistivity (Ωcm) was calculated for each polymer film prepared in duplicate by the van der Pauw method. FIG. 7 shows the relationship between the pyrrole/aniline monomer ratio and resistivity of the resulting films.

The results show that the presence of a comonomer in the photopolymerization formulation can be utilized to change and/or control the resistance of the resulting mixed conducting polymer film. A maximum in resistance was obtained in the molar ratio range between about 35 and about 70 percent (%) of aniline present in the formulation. At higher aniline ratios (>70%), the resistance decreased. The lowest resistances were found for films with little or no aniline present. However, polymer films with aniline present in the formulation exhibited smoother film surfaces. The same results were obtained using fiber-glass epoxy and polyimide PWB substrates.

The waterborne acrylic resin did not undergo successful copolymerization with pyrrole. It was possible to make a film only if it was added at amounts less than 4 wt %, however, resulting in reduced conductivity. Acrylic resins undergo very little cationic polymerization (mostly radical induced), which is incompatible with the photopolymerization of pyrrole.

Copolymerization of pyrrole with bisphenol A diglycidyl ether, which undergoes a cationic photopolymerization mechanism, resulted in good films covering a large range of pyrrole/copolymer ratios from 10:1 to 1:1. It may be noted that on using the ferrocinium photoinitiator and bisphenol A diglycidyl ether alone, a yellow nonconducting film was obtained. Conductivities of PPY/epoxide copolymers were approximately an order of magnitude lower than that of PPY films without a copolymer. Increasing the amount of epoxy copolymer up to a ratio of 1:1 resulted in an order of magnitude decrease in conductivity as shown in Table 4. PPY/epoxide copolymers possessed good flexibility and exhibited softness, the latter increasing when higher amounts of epoxide copolymer were added. Also, these films adhered very well to metallic and nonmetallic substrates, and it was difficult to peel them off, partly due to their softness.

Photocopolymerization with relatively low concentrations of perfluorinated sulfonic acid appeared to be successful, and high electronic conductivities were retained. At higher concentrations of Nafion copolymer (10 wt %), the conductivity values were unobtainable and decreased, indicating a structure of mixed conducting pyrrole and nonconducting (or ionically conducting) Nafion.

EXAMPLE 8

A test was performed using a high resolution laser and an electron-beam for the patterning of conducting polypyrrole lines.

Figure 8:
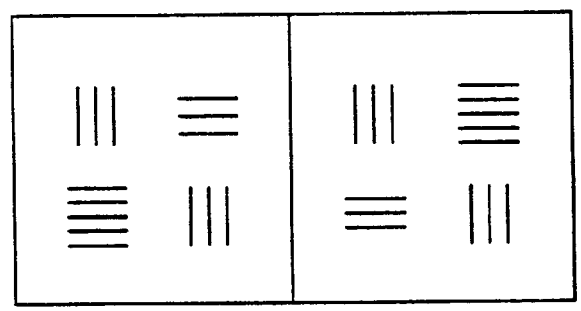
FIG. 8 is a photograph of alumina substrates with laser and electron beam patterned lines of electronically conducting polypyrrole.
Figure 8:
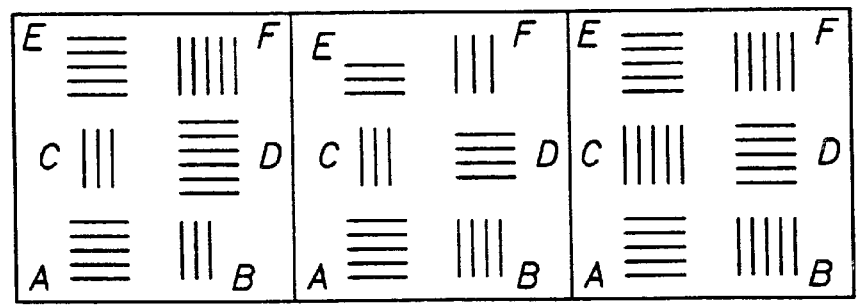

Referring now to FIG. 8, alumina substrates, (bottom row, one inch by one inch substrates), have laser patterned lines formed from a 4:1 pyrrole:silver nitrate formulation spun at 500, 300, and 1000 RPM, respectively. Each alumina substrate contains several sets of 3–5 lines obtained with a different number of laser beam passes. Alumina substrates shown in the top row (one inch by one inch substrates) have laser patterned lines using an 8:1 pyrrole:silver nitrate formulation spun at 500 and 1000 RPM, respectively. The small alumina substrate has a patterned line formed from a 4:1 pyrrole:silver nitrate formulation photopolymerized by a 10 nm wide electron beam. Each of the formulations contained acetonitrile.

The parameters (beam current, beam sweep rate, number of passes) were varied for each set of exposures to test the photopolymerization process. Line widths obtained using argon ion laser imaging were about 100 microns.

An electron beam was used to fabricate both narrow lines (down to 1.5 microns wide) and wide lines (about 80 microns wide) (See FIG. 8), using the same exposure parameters, but two different techniques. The narrow lines were fabricated using a step and repeat technique, (i.e. the electron beam was moved across the sample and the sample moved between exposures) to form a number of parallel lines with approximately equal line widths and spacing. The wide lines were fabricated by exposing narrow lines together (side by side), with sufficient overlap to eliminate any visible rastering under SEM examination.

EXAMPLE 9

Figure 9A:
FIGS. 9A and 9B are scanning electron micrographs of the cross-sections of polypyrrole films formed electrochemically and photochemically.
Figure 9B:
Figure 10A:
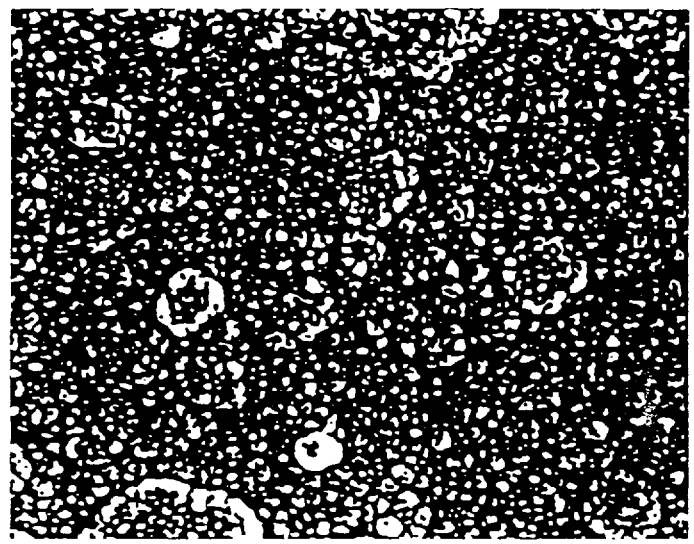
FIGS. 10A, 10B, 10C, and 10D are contains scanning electron micrographs of the surfaces of polypyrrole films formed electrochemically and photochemically.
Figure 10B:
Figure 10C:
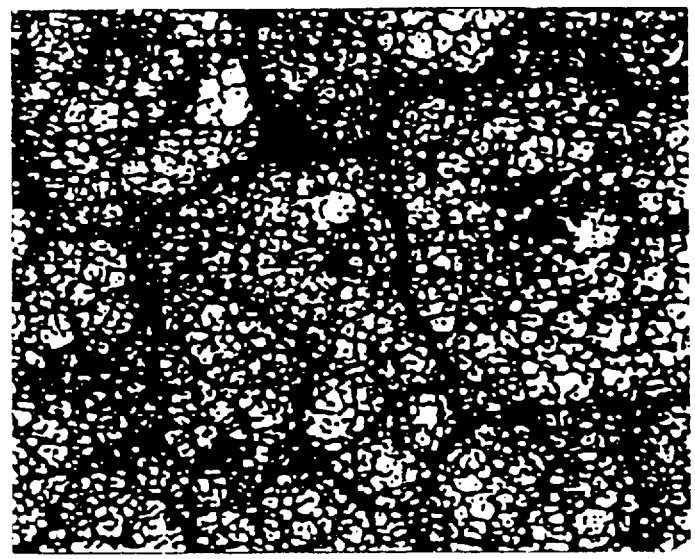
Figure 10D:
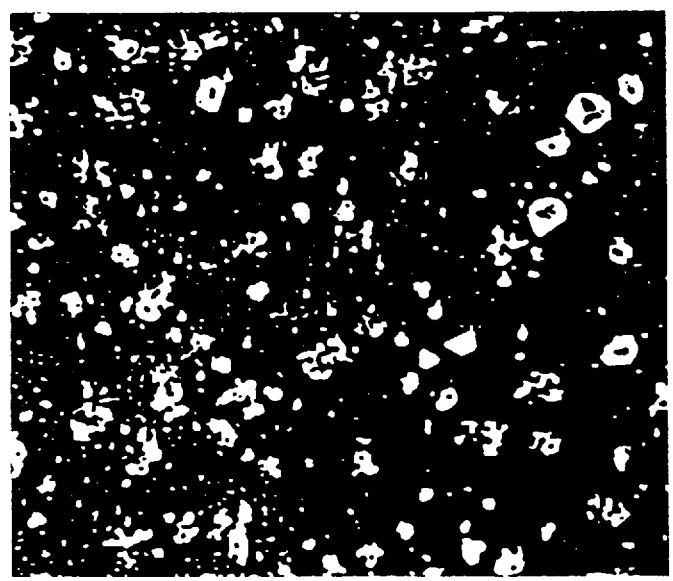
Figure 11:
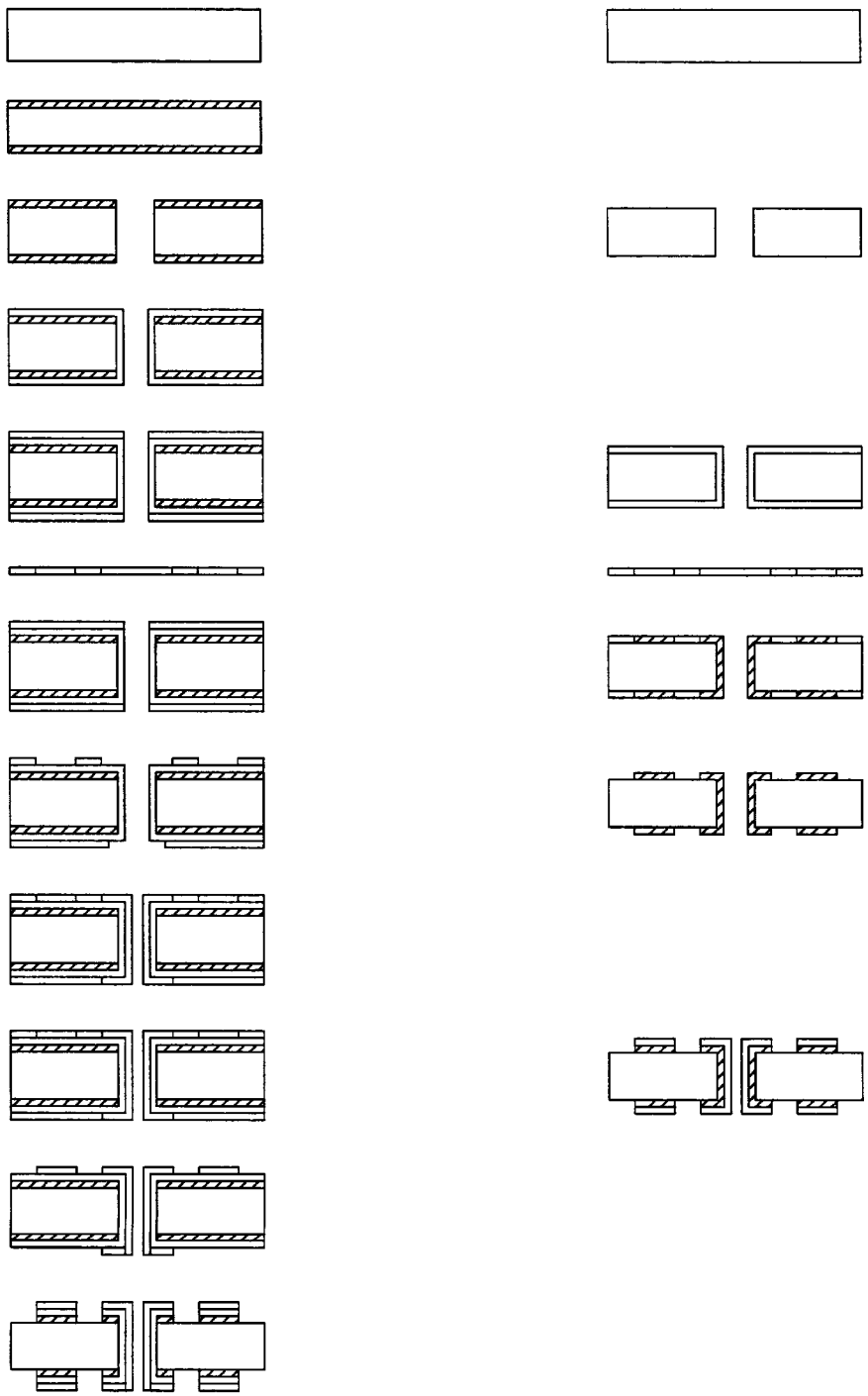
FIG. 11 is a flow chart comparing the steps of conventional PWB fabrication with those of the present invention.

Scanning electron micrographs of fracture surfaces of thick photopolymerized (70 microns) and electropolymerized (67 microns) polypyrrole films are shown in FIG. 9. It can be seen from FIG. 9(a) that electrochemically prepared polypyrrole is dense, non-fibrillar and volume-filling. The photopolymerized polypyrrole material of FIG. 9(b) is surprisingly compact, but more open-structured and contains some voids.

Scanning electron micrographs at two magnifications of the outer surfaces of electropolymerized and photopolymerized polypyrrole films are presented in FIG. 10. Now referring to FIGS. 10(a) and 10(c), an electrochemically prepared polypyrrole is shown to have nodular or "cauliflower" structures that are consistent with a nucleationi/ dendritic film growth mechanism. This surface topology is frequently observed for electrochemically prepared polypyrrole materials. In contrast, the surface topography for the photopolymerized polypyrrole films shown in FIGS. 10(b) and 10(d) was rather featureless, being smooth and flat. As observed in the micrograph of the fractured surface of photopolymerized PPY in FIG. 9(b), a large number of evenly distributed silver metal grains of surprisingly uniform size can be seen also on its outer surface. In the higher magnification electron micrograph FIG. 10(d), the bright, reflective, spherical Ag particles were determined to be 1 $\mu$m or less in diameter. Also in this micrograph, the microporous structure of the photopolymerized film can be clearly seen. For both polypyrrole film types, the surfaces adhering to the substrates were smooth, shiny and featureless.

APPLICATION OF PHOTOPOLYMERIZED CONDUCTING POLYMERS TO FORM PASSIVE ELECTRONIC ELEMENTS

The resistivity of electronically conducting polymer lines, such as those shown in FIG. 8, can be controlled by the concentration or type of dopant anions from an electron acceptor salt (See FIGS. 1 and 2) or the concentration and type of copolymers present in the starting formulation (See FIG. 7). Whereas varying the concentration of either component in a formulation can effect resistivity, it is preferred that the pyrrole:comonomer ratio in the formulation, particularly the pyrrole:aniline ratio, be optimized to provide a conducting polymer with good adhesion and smoothness on the substrate. The preferred copolymer is aniline and the prefered pyrrole:aniline mole ratios are between about 1 and about 100. It is also prefered that the concentration of electron acceptor salts including the dopant anions in the formulation be used to determine the approximate resistivity of the electronically conducting polymer lines produced upon photopolymerization of the formulation.

The overall resistivity of an electronically conducting polymer resistor is a function of the resistivity of the photopolymerized formulation as well as the thickness, width and length of the resistor. A plurality of resistors can be formed on a common substrate, where the resistors have various overall resistances on the order of about 10 ohms ($\Omega$) to about 10 M$\Omega$. One preferred method for forming resistors with various resistances in a single layer on a substrate involves the preparation of a plurality of formulations having different concentrations of the electron acceptor salt. Each formulation can be used to form resistors having resistances within a certain range. Increasing the electron acceptor salt concentration, such as AgNO$_3$, increases the conductivity and decreases the resistivity of the photopolymerized conducting polymer. For example, a first formulation might be used to form about 10–100 $\Omega$ resistors and two more formulations might be used to form about 100–10,000 $\Omega$ and about 10 K$\Omega$–10 M$\Omega$ resistors, respectively. Only one formulation is applied, dried and photopolymerized at a time. Each individual formulation is spin-coated onto the substrate to form a film having substantially uniform thickness. After allowing time for the formulation to dry, select areas or lines are photopolymerized using any of the techniques previously described, e.g., masked UV light, laser light, or electron beams. The unpolymerized formulation is then washed from the substrate surface by a suitable solvent. Since the thickness of the resistor lines are substantially uniform, due to the spin-coating of the formulation, and the length of the resistor must span between two conductor contact points, it is preferred that the width of the resistor be varied to achieve a desired resistance.

It is preferred that the width of each resistor be established by photopolymerizing resistor lines having a width that will form the desired resistance. However, because the photopolymerization process may form lines having sides that are not entirely uniform or smooth, it may be difficult to obtain resistors having resistances within narrow tolerances without further processing.

After the resistors have received a post thermal cure, the overall resistance of a resistor may be increased by reducing the width of the resistor line through laser trimming. Therefore, in applications where a precise resistance is necessary or desirable, it is preferred to photopolymerize a resistor line having a width slightly greater than is needed to achieve the desired resistance, thereby forming a resistor having a resistance lower than desired, and then trim the width of the resistor with a laser until the resistance increases to the desired value.

After all the resistors having resistances within the first formulation's useful range have been formed, additional formulations may be used to obtain resistors within other ranges. Any number of formulations may be applied in this manner having wide or narrow resistance ranges.

Therefore, the preferred method of forming a plurality of resistors having various resistances involves spin-coating, drying, photopolymerizing and washing a first formulation, then repeating these steps for each remaining formulation. Only after all resistors have been photopolymerized will they receive a single thermal cure and each of the resistors, regardless of formulation, will be laser trimmed to a specific resistance.

CAPACITORS

It is believed that solid electrolytic capacitors, in which an electronically conducting polymer is applied as an electrolyte, could be fabricated that would exhibit good frequency and thermal stability characteristics. The conducting polymers could be photopolymerized on the surface of dielectric materials, such as etched or anodized aluminum and tantalum, to form a solid state electrolytic capacitor in which a conductive polymer is applied as an electrolyte.

For example, a process for forming a solid state electrolytic capacitor might comprise the steps of applying a thin film of a formulation on a dielectric layer; photopolymerizing a portion of the film; removing the unpolymerized portion of the film from the substrate with a solvent; depositing a layer of palladium onto the surface of photopolymerized polymer by immersion in solution consisting of a palladium containing salt; and electrodepositing a layer of a metal conductor such as gold, copper or platinum onto palladium precoat.

INDUCTORS

Figure 12:
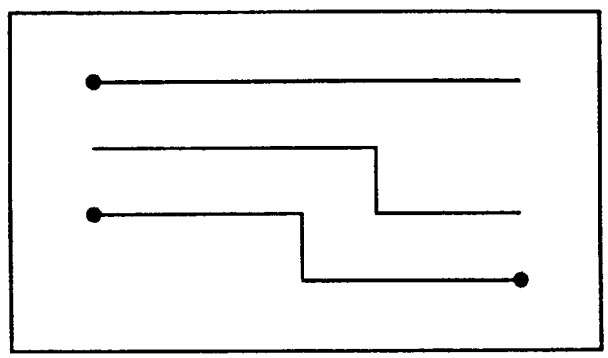
FIG. 12 is a photograph of black conducting polypyrrole lines on a fiberglass/epoxy PWB substrate patterned using UV illumination through a shadow mask, wherein one line has been electrodeposited with copper.
Figure 13:
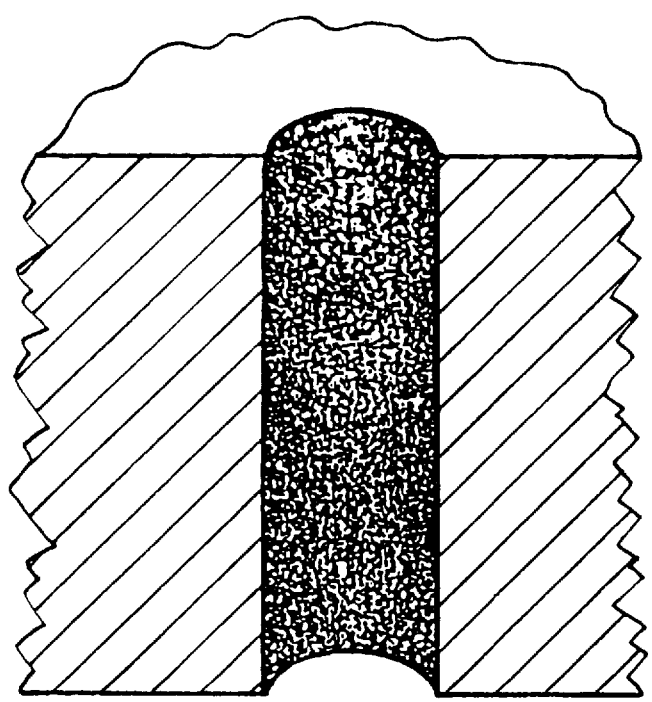
FIG. 13 is a photograph of a copper-on-polypyrrole plated 0.025 inch diameter through-hole.
Figure 14:
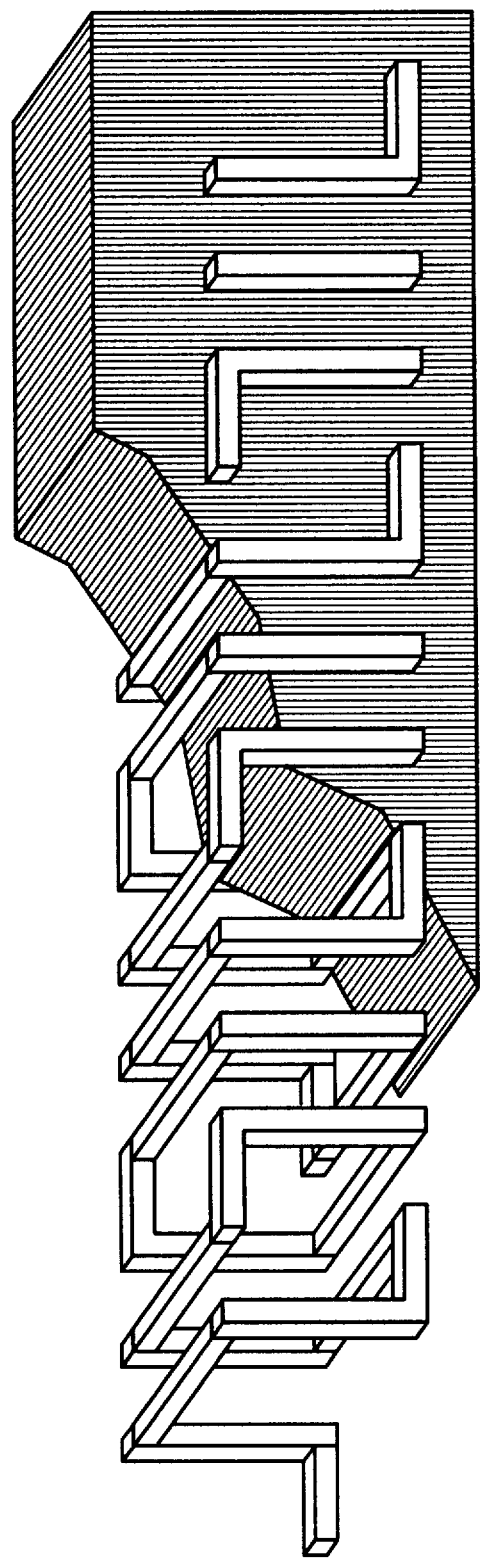
FIG. 14 is a perspective view of an inductor fabricated with photopolymerized conducting polymers in vertical paths through a dielectric layer.

Flat spiral inductors made by printing or defining conductor patterns directly onto a substrate exhibit relatively low Q factors and also, since inductance is directly proportional to the overall size and the number of turns, require extensive substrate area to achieve high values. However, the methods disclosed above can be used to form three-dimensional, high inductance inductors, as shown in FIG. 14, by the photopolymerization of a conducting polymer in vertical paths through a dielectric layer. The preferred method of forming three-dimensional inductors comprises the steps of: (i) photopolymerizing a conducting polymer on a substrate with subsequent metallization, (ii) deposition of a dielectric layer whether by photopolymerization or other means, (iii) drilling holes (on the order of about 250 $\mu$m and smaller) in the dielectric layer by laser ablation, (iv) simultaneous photopolymerization of the through-holes and conducting lines on the top of the dielectric layer, and (v) metallization of the conducting polymer vias (both through-holes and conducting lines. (See FIGS. 12 and 13) The deposition of conducting polymers on through-hole walls can be achieved by coating the walls with a layer of photopolymerizable material (See FIG. 13), preferably in the same step that the material is coated on the top surface of the dielectric material. It is also preferred that the photopolymerization of the through-holes and conducting polymers on the top surface be carried out simultaneously.

Spontaneous deposition of noble metals, e.g. palladium (Pd) and silver (Ag), onto polypyrrole occurs simply by immersing the substrate in an aqueous solution containing the corresponding metal salt. It may also be possible to spontaneously deposit gold (Au), and other metals on photopolymerized polypyrrole. The preferred noble metal is palladium. While palladium may be used with any $Pd^{2+}$ salt, (i.e. $PdBr_2$, $PdCl_2$) the most preferred metal salt is palladium bromide.

The ease with which conducting polymer-based passive elements can be mounted on PWB and MCM substrates using computer controlled lasers reduces the time and expense of producing prototype quantities of passive elements, PWBs, and MCMs. An additional benefit of this technique is that laser trimming for active circuit adjustment even at the MCM level is easily attainable. Thus, the passive elements, particularly the resistor values, can be customized to desired specifications even after the circuit, on MCMs or PWBs, has already been assembled and the components mounted.

The methods of the present invention may be used alone or in combination with other technology for forming multichip modules. Specifically, it is anticipated that the passive elements of the present invention may be incorporated into integrated circuits formed primarily using thin film or thick film technologies. For example, a specific circuit may be optimized by using a resistor according to the present invention. The remainder of the integrated circuit, including logic elements, conductive lines and the like, may be formed on a substrate using chemical vapor deposition (CVD) and physical vapor deposition (PVD). The integrated circuit is formed layer by layer until the resistor is needed. The underlying layer will preferably provide a pair of conductive leads on which the resistor is formed. Following formation of the resistor, the surface of the substrate may be planarized and the resistor covered by conventional dielectric chemical vapor deposition (DCVD). Formation of integrated circuits may continue on the same or subsequent layers.

It will be understood that certain combinations and subcombinations of the invention are of utility and may be employed without reference to other features in subcombinations. This is contemplated by and is within the scope of the present invention. As many possible embodiments may be made of this invention without departing from the spirit and scope thereof, it is to be understood that all matters hereinabove set forth or shown in the accompanying drawings are to be interpreted as illustrative and not in a limiting sense.

What is claimed is:

1. A method of forming an electronically conducting polymer resistor comprising the steps of:
    (a) applying a film of a formulation comprising pyrrole monomer and a salt onto a surface, wherein the salt consists of an electron acceptor containing $Ag^+$ cations and a dopant anion selected from $NO_3^-$, $NO_2^-$, $BF_4^-$, $ClO_4^-$, tosylate, or mixtures thereof;
    (b) photopolymerizing a portion of the film to form the resistor; and
    (c) removing the formulation adjacent the resistor.

2. The method of claim 1 wherein the formulation has a pyrrole:$Ag^+$ cation molar ratio greater than about 0.5, and a pyrrole:dopant anion molar ratio greater than about 0.5.

3. The method of claim 1 wherein the formulation has a pyrrole:$Ag^+$ cation molar between about 0.5 and about 20, and a pyrrole:dopant anion molar ratio between about 0.5 and about 20.

4. The method of claim 1 wherein the formulation further comprises a comonomer, and wherein the formulation has a pyrrole:comonomer molar ratio between about 1 and about 100.

5. The method of claim 1 wherein the film further comprises a photoinitiator.

6. The method of claim 5 wherein the film further comprises a surfactant.

7. The method of claim 1 wherein the formulation further comprises a solvent, and the method further comprises the step of evaporating the solvent from the film before photopolymerizing.

8. The method of claim 1 wherein the film is selectively photopolymerized by direct laser light.

9. The method of claim 8 wherein the laser light has a wavelength between about 457 and about 1060 nanometers.

10. The method of claim 1 wherein the film is selectively photopolymerized by an electron beam.

11. The method of claim 1 wherein the film is applied by spin coating at between about 250 and about 2,000 rotations per minute.

12. The method of claim 1 wherein the film is selectively photopolymerized by an electron beam.

13. The method of claim 1, wherein the resistor is photopolymerized by direct laser light.

14. The method of claim 13, wherein the direct laser light is provided by a continuous wave argon-ion laser.

15. The method of claim 13, wherein the direct laser light is provided by a laser beam moving at a linear velocity of between about 2 and about 16 millimeters per minute.

16. The method of claim 1 wherein the formulation has a pyrrole:$Ag^+$ cation molar ratio greater than about 0.5.

17. The method of claim 1 wherein the formulation has a pyrrole:dopant anion molar ratio greater than about 0.5.

18. The method of claim 1 wherein the formulation has a pyrrole:$Ag^+$ cation molar ratio in the formulation between about 0.5 and about 20.

19. The method of claim 1 wherein the formulation has a pyrrole:dopant anion molar ratio between about 0.5 and about 20.

20. The method of claim 1 wherein directed laser light is used to perform the photopolymerizing step.

21. The method of claim 1 wherein ultraviolet light is used to perform the photopolymerizing step.

22. The method of claim 1 wherein an electron beam is used to perform the photopolymerizing step.

23. The method of claim 1, wherein the film has a thickness between about 5 and about 300 micrometers.

24. The method of claim 1, wherein the film is applied by a method selected from brush coating, spraying, dipping or spin coating.

25. A method of forming an electronically conducting polymer resistor on a conducting or nonconducting surface comprising the steps of:
   (a) applying a film of a formulation onto the surface, wherein the formulation comprises pyrrole, aniline, $Ag^+$ cations and a dopant anion selected from $NO_3^-$, $NO_2^-$, $BF_4^-$, $ClO_4^-$, tosylate, and mixtures thereof, wherein the formulation has a pyrrole:aniline molar ratio between about 1 and about 100; and
   (b) photopolymerizing the film over a portion of the surface to form the resistor.

26. The method of claim 25, wherein the $Ag^+$ cations and the dopant anion are provided in the formulation as a salt, and wherein a pyrrole:salt molar ratio is greater than about 0.5.

27. A method of forming an electronically conducting polymer resistor on a conducting or nonconducting surface comprising the steps of:
   (a) applying a film of a formulation onto the surface, wherein the formulation comprises pyrrole, $Ag^+$ cations and a dopant anion selected from $NO_3^-$, $NO_2^-$, $BF_4^-$, $ClO_4^-$, tosylate, or mixtures thereof;
   (b) photopolymerizing the film over a portion of the surface to form the resistor; and
   (c) heating the resistor to provide a post-thermal cure at a temperature of between about 25 and about 100 degrees Celsius for between about 0.1 and about 3 hours.

28. A method of forming an electronically conducting polymer resistor comprising the steps of:
   (a) applying a film of a formulation comprising pyrrole monomer and a salt onto a substrate surface, the salt consisting essentially of $Ag^+$ cations and dopant anions selected from $NO_3^-$, $NO_2^-$, $BF_4^-$, $ClO_4^-$, tosylate, or mixtures thereof;
   (b) photopolymerizing a portion of the film to form the resistor; and
   (c) removing the formulation adjacent the resistor.

29. The method of claim 28 further comprising the steps of:
   (d) measuring the resistance of the resistor;
   (e) increasing the resistance of the resistor by trimming the resistor with a laser; and
   (f) repeating steps (d) and (e) until a desired resistance is obtained.

30. A method of forming a plurality of electronically conducting polymer resistors having different electrical resistances on a common substrate surface, the method comprising the steps of:
   (a) preparing a plurality of formulations comprising a monomer and a salt, wherein the salt consists of $Ag^+$ cations and a dopant anion selected from $NO_3^-$, $NO_2^-$, $BF_4^-$, $ClO_4^-$, tosylate, or mixtures thereof, and wherein each of the formulations has a different molar concentration of salt for forming resistors having resistances within a given range;
   (b) applying a film of a formulation onto the substrate surface;
   (c) photopolymerizing a portion of the film to form a resistor, wherein the resistor extends between two contact points and has sufficient thickness and width so that the overall electrical resistance between the two contact points is somewhat less than a resistance specified for that resistor;
   (d) removing the formulation adjacent the resistor;
   (e) repeating steps (b) through (d) for each of the plurality of formulations;
   (f) heating the resistors to provide a thermal cure;
   (g) measuring the overall resistance of the resistor;
   (h) increasing the overall resistance of the resistor up to a specified resistance by trimming the resistor with a laser; and
   (i) repeating steps (g) and (h) until each resistor has an overall resistance near the resistance specified for that resistor.

31. The method of claim 30 wherein the monomer is pyrrole and the salt is silver nitrate.

32. A method of forming an electronically conducting polymer inductor on a nonconducting substrate surface comprising the steps of:
   (a) preparing a formulation;
   (b) applying a first film of the formulation onto the substrate surface;
   (c) photopolymerizing a plurality of lower lines in the film;
   (d) removing the formulation adjacent the lines;
   (e) depositing a layer of dielectric material over the lower lines, wherein the layer forms a top surface;
   (f) forming holes through the layer of dielectric material and into communication with ends of at least two lower lines;
   (g) applying the formulation to the holes and top surfaces of the dielectric material to form a second film over the top surface; and (h) selectively photopolymerizing the second film to form vertical vias and upper lines, wherein ends of each upper line connect with the vertical vias, and wherein the upper lines, lower lines and vertical vias are electronically conducting and cooperate to form the inductor.

33. The method of claim 32, wherein the formulation comprises a monomer and a silver salt, the silver salt comprising $Ag^+$ cations and a dopant anion selected from $NO_3^-$, $NO_2^-$, $BF_4^-$, $ClO_4^-$, tosylate, or mixtures thereof.

34. The method of claim 33, wherein the monomer is selected from pyrrole, aniline, or mixtures thereof.

35. The method of claim 33, wherein the monomer is selected from pyrrole, substituted derivatives of pyrrole, aniline, substituted derivatives of aniline, or mixtures thereof.

36. A method of forming a solid state electrolytic capacitor in which a conducting polymer is applied as an electrolyte comprising the steps of:
   (a) applying a film of a formulation on a dielectric layer;
   (b) photopolymerizing a portion of the film to form a polymer;
   (c) removing the formulation adjacent the polymer;
   (d) depositing a layer of palladium onto the polymer by immersion in a solution consisting of a palladium containing salt; and
   (e) electrodepositing a layer of a metal conductor to form the capacitor.

37. The method of claim 36, wherein the formulation comprises a monomer and a silver salt, the silver salt comprising $Ag^+$ cations and a dopant anion selected from $NO_3^-$, $NO_2^-$, $BF_4^-$, $ClO_4^-$, tosylate, or mixtures thereof.

38. The method of claim 37, wherein the monomer is selected from pyrrole, aniline, or mixtures thereof.

39. The method of claim 37, wherein the monomer is selected from pyrrole, substituted derivatives of pyrrole, aniline, substituted derivatives of aniline, or mixtures thereof.

40. A method of forming a plurality of passive elements on a common nonconducting substrate surface comprising the steps of:
   (a) preparing a formulation comprising a monomer and a salt, wherein the salt consists of an electron acceptor consisting of $Ag^+$ cations and a dopant anion selected from $NO_3^-$, $NO_2^-$, $BF_4^-$, $ClO_4^-$, tosylate, or mixtures thereof;
   (b) forming an electronically conducting polymer resistor on the surface comprising the steps of:
      (i) applying a film of the formulation onto the substrate surface;
      (ii) photopolymerizing a first portion of the film to form a resistor; and
      (iii) removing the formulation adjacent the resistor;
   (c) forming a solid state electrolytic capacitor on the surface wherein a conducting polymer is applied as an electrolyte comprising the steps of:
      (i) applying a film of the formulation on a dielectric layer;
      (ii) photopolymerizing a second portion of the film to form a polymer;
      (iii) removing the formulation adjacent the polymer;
      (iv) depositing a layer of palladium onto the surface of the polymer by immersion in a palladium salt solution; and
      (v) electrodepositing a layer of a metal conductor; and
   (d) forming an electronically conducting polymer inductor on the nonconducting substrate surface comprising the steps of:
      (i) applying a film of the formulation onto the substrate surface;
      (ii) photopolymerizing a plurality of lower lines in the film;
      (iii) removing the formulation adjacent the lines;
      (iv) depositing a layer of dielectric material over the lower lines, wherein the layer forms a top surface;
      (v) forming holes through the layer of dielectric material and into communication with ends of at least two lower lines;
      (vi) applying the formulation to the holes and top surface of the dielectric material to form a second film over the top surface; and
      (vii) selectively photopolymerizing the second film to form vertical vias and upper lines, wherein ends of each upper line connect with the vertical vias, and wherein the upper lines, lower lines and vertical vias are electronically conducting and cooperate to form the inductor.

41. A method of making a resistor on a substrate surface, comprising the steps of:
   (a) forming an electronically conducting polymer resistor between two points on the substrate surface; and
   (b) trimming the polymer with a laser.

42. The method of claim 41, further comprising the steps of:
   (c) measuring electronic resistance between the two points; and
   (d) repeating steps (b) and (c).

43. A method for selectively photopolymerizing a film of a photopolymerizable formulation comprising the steps of:
   (a) directing laser light on the film of the photopolymerizable formulation to form a polymer;
   (b) rastering the beam over a specified area of the film; and
   (c) removing the formulation adjacent the polymer.

44. The method of claim 43, wherein the beam is moved at a linear velocity of between about 2 and about 16 millimeters per minute.

45. The method of claim 44, wherein the direct laser light is provided at a beam power of between about 300 and about 400 milliwatts.

46. The method of claim 43, wherein the laser light is directed through a condensing lens to form a beam having a width of about 150 micrometers.

47. A method of forming an electronically conducting polymer resistor on a conducting or nonconducting substrate surface comprising the steps of:
   (a) applying a film of a formulation comprising pyrrole monomer and a salt onto the substrate surface, the salt consisting essentially of $Ag^+$ cations and dopant anions selected from $NO_3^-$, $NO_2^-$, $BF_4^-$, $ClO_4^-$, tosylate, or mixtures thereof;
   (b) photopolymerizing a portion of the film to form the resistor; and
   (c) removing the formulation adjacent the resistor.

48. The method of claim 47, further comprising the step of:
   (d) heating the resistor to provide a post-thermal cure.

49. The method of claim 48, wherein the resistor is cured at a temperature of between about 25 and about 100 degrees Celsius for between about 0.1 and about 3 hours.

50. The method of claim 48, further comprising the step of:
   (e) trimming the resistor with a laser.

51. The method of claim 48, further comprising the steps of:
  (e) measuring the resistance of the resistor; and
  (f) increasing the resistance of the resistor by trimming the resistor with a laser.

52. The method of claim 51, further comprising the step of:
  (g) repeating steps (e) and (f) until a desired resistance is measured.

53. A method of forming a resistor comprising the steps of:
  (a) applying a film of a formulation comprising pyrrole and a silver salt onto a surface;
  (b) photopolymerizing a portion of the film to form the resistor; and
  (c) removing the formulation adjacent the resistor.

54. A method of forming an electronically conducting polymer resistor on a conducting or nonconducting surface comprising the steps of:
  (a) applying a film of a formulation onto the surface, wherein the formulation comprises pyrrole, $Ag^+$ cations and a dopant anion selected from the group consisting of $NO_3^-$, $NO_2^-$, $BF_4^-$, $ClO_4^-$, tosylate, or mixtures thereof; and
  (b) photopolymerizing a portion of the film to form the resistor;
  (c) increasing the resistance of the resistor by trimming the resistor.

55. The method of claim 54 further comprising the steps of:
  (d) measuring the resistance of the resistor; and
  (e) repeating steps (c) and (d).

56. The method of claim 55 wherein step (e) is performed until a desired resistance is obtained.

57. The method of claim 54 wherein a laser is used in step (c) for trimming the resistor.

58. A method of forming an electronically conducting polymer resistor on a surface comprising the steps of:
  (a) applying a film of a formulation onto the surface, wherein the formulation comprises pyrrole, $Ag^+$ cations and a dopant anion selected from $NO_3^-$, $NO_2^-$, $BF_4^-$, $ClO_4^-$, tosylate, or mixtures thereof;
  (b) photopolymerizing the film over a select area of the surface to form the resistor without forming deposits outside the select area; and
  (c) removing the formulation adjacent the resistor.

59. A method of forming an electronically conducting polymer resistor on a nonsemiconducting surface comprising the steps of:
  (a) applying a film of a formulation onto the nonsemiconducting surface, wherein the formulation comprises pyrrole, $Ag^+$ cations and a dopant anion selected from $NO_3^-$, $NO_2^-$, $BF_4^-$, $ClO_4^-$, tosylate, or mixtures thereof; and
  (b) photopolymerizing a portion of the film to form the resistor.

60. A method of forming an electronically conducting polymer resistor on a conducting or nonconducting surface comprising the steps of:
  (a) applying a film of a formulation onto the surface, wherein the formulation comprises pyrrole, $Ag^+$ cations and a dopant anion selected from $NO_3^-$, $NO_2^-$, $BF_4^-$, $ClO_4^-$, tosylate, or mixtures thereof;
  (b) photopolymerizing the film over a portion of the surface to form the resistor without depositing silver on other portions of the surface; and
  (c) removing the formulation adjacent the resistor.

61. A method of forming an electronically conducting polymer resistor on a conducting, semiconducting or nonconducting surface comprising the steps of:
  (a) applying a film of a formulation onto the surface, wherein the formulation comprises pyrrole, $Ag^+$ cations and a dopant anion selected from $NO_3^-$, $NO_2^-$, $BF_4^-$, $ClO_4^-$, tosylate, or mixtures thereof;
  (b) polymerizing a portion of the film to form the resistor, wherein the step of polymerizing consists of photopolymerizing; and
  (c) heating the resistor to provide a post-thermal cure.

* * * * *